(12) United States Patent
Shannon et al.

(10) Patent No.: US 8,357,264 B2
(45) Date of Patent: *Jan. 22, 2013

(54) PLASMA REACTOR WITH PLASMA LOAD IMPEDANCE TUNING FOR ENGINEERED TRANSIENTS BY SYNCHRONIZED MODULATION OF A SOURCE POWER OR BIAS POWER RF GENERATOR

(75) Inventors: Steven C. Shannon, Raleigh, NC (US); Kartik Ramaswamy, San Jose, CA (US); Daniel J. Hoffman, Saratoga, CA (US); Matthew L. Miller, Fremont, CA (US); Kenneth S. Collins, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1152 days.

This patent is subject to a terminal disclaimer.

(21) Appl. No.: 12/128,963

(22) Filed: May 29, 2008

(65) Prior Publication Data

US 2009/0294062 A1 Dec. 3, 2009

(51) Int. Cl.
*H01L 21/00* (2006.01)
*C23C 16/00* (2006.01)

(52) U.S. Cl. ......... 156/345.28; 156/345.43; 156/345.44; 156/345.47; 118/723 R

(58) Field of Classification Search ............. 118/723 R; 156/345.24, 345.28, 345.43, 345.47, 345.44, 156/345.48

See application file for complete search history.

(56) References Cited

U.S. PATENT DOCUMENTS

| | | | |
|---|---|---|---|
| 5,314,603 A | 5/1994 | Sugiyama et al. | 204/298.32 |
| 5,474,648 A | 12/1995 | Patrick et al. | 438/10 |
| 5,643,364 A | 7/1997 | Zhao et al. | 118/723 |
| 6,027,601 A | 2/2000 | Hanawa | 156/345 |
| 6,472,822 B1 | 10/2002 | Chen et al. | |
| 6,589,437 B1 | 7/2003 | Collins | 216/68 |
| 6,677,711 B2 | 1/2004 | MacGearailt | 315/111.21 |
| 6,818,562 B2 | 11/2004 | Todorow et al. | 438/710 |
| 6,920,312 B1 | 7/2005 | Benjamin | 455/69 |
| 7,030,335 B2 | 4/2006 | Hoffman et al. | 219/121.43 |
| 7,084,832 B2 | 8/2006 | Pribyl | |
| 7,157,857 B2 | 1/2007 | Brouk et al. | |
| 7,205,034 B2 | 4/2007 | Kawamura et al. | |
| 7,431,857 B2 | 10/2008 | Shannon et al. | |
| 7,749,353 B2 | 7/2010 | Rusu et al. | |
| 7,812,278 B2 | 10/2010 | Shannon | |
| 7,952,048 B2 | 5/2011 | Choi et al. | |
| 2004/0107906 A1* | 6/2004 | Collins et al. | 118/723 I |
| 2004/0222184 A1 | 11/2004 | Hayami et al. | |
| 2006/0278609 A1 | 12/2006 | Hoffman | 216/61 |
| 2008/0180028 A1 | 7/2008 | Collins et al. | 315/111.21 |
| 2009/0159439 A1 | 6/2009 | Pipitone et al. | 204/298.03 |

OTHER PUBLICATIONS

Official Action Dated Jun. 28, 2011 Issued in Co-Pending U.S. Appl. No. 12/129,024.
Official Action Dated Jan. 3, 2011 Issued in Co-Pending U.S. Appl. No. 12/129,244.

(Continued)

*Primary Examiner* — Ram N. Kackar
(74) *Attorney, Agent, or Firm* — Robert M. Wallace

(57) ABSTRACT

In a plasma reactor employing source and bias RF power generators, plasma is stabilized against an engineered transient in the output of either the source or bias power generator by a compensating modulation in the other generator.

8 Claims, 27 Drawing Sheets

OTHER PUBLICATIONS

Official Action Dated Jan. 6, 2011 Issued in Co-Pending U.S. Appl. No. 12/129,155.
Official Action Dated Apr. 6, 2011 Issed in Co-Pending U.S. Appl. No. 12/129,244.
U.S. Appl. No. 12/128,926, filed May 29, 2008, Shannon et al.
U.S. Appl. No. 12/129,024, filed May 29, 2008, Shannon et al.
U.S. Appl. No. 12/129,091, filed May 29, 2008, Shannon et al.
U.S. Appl. No. 12/129,155, filed May 29, 2008, Shannon et al.
U.S. Appl. No. 12/129,202, filed May 29, 2008, Shannon et al.
U.S. Appl. No. 12/129,244, filed May 29, 2008, Shannon et al.
U.S. Appl. No. 12/129,318, filed May 29, 2008, Shannon et al.
Offical Action dated Jun. 26, 2012 Issued in Co-Pending U.S. Appl. No. 12/129,091.
Offical Action dated Jul. 5, 2012 Issued in Co-Pending U.S. Appl. No. 12/128,926.
Offical Action dtaed Aug. 27, 2012 Issued in Co-Pending U.S. Appl. No. 12/129,091.

* cited by examiner

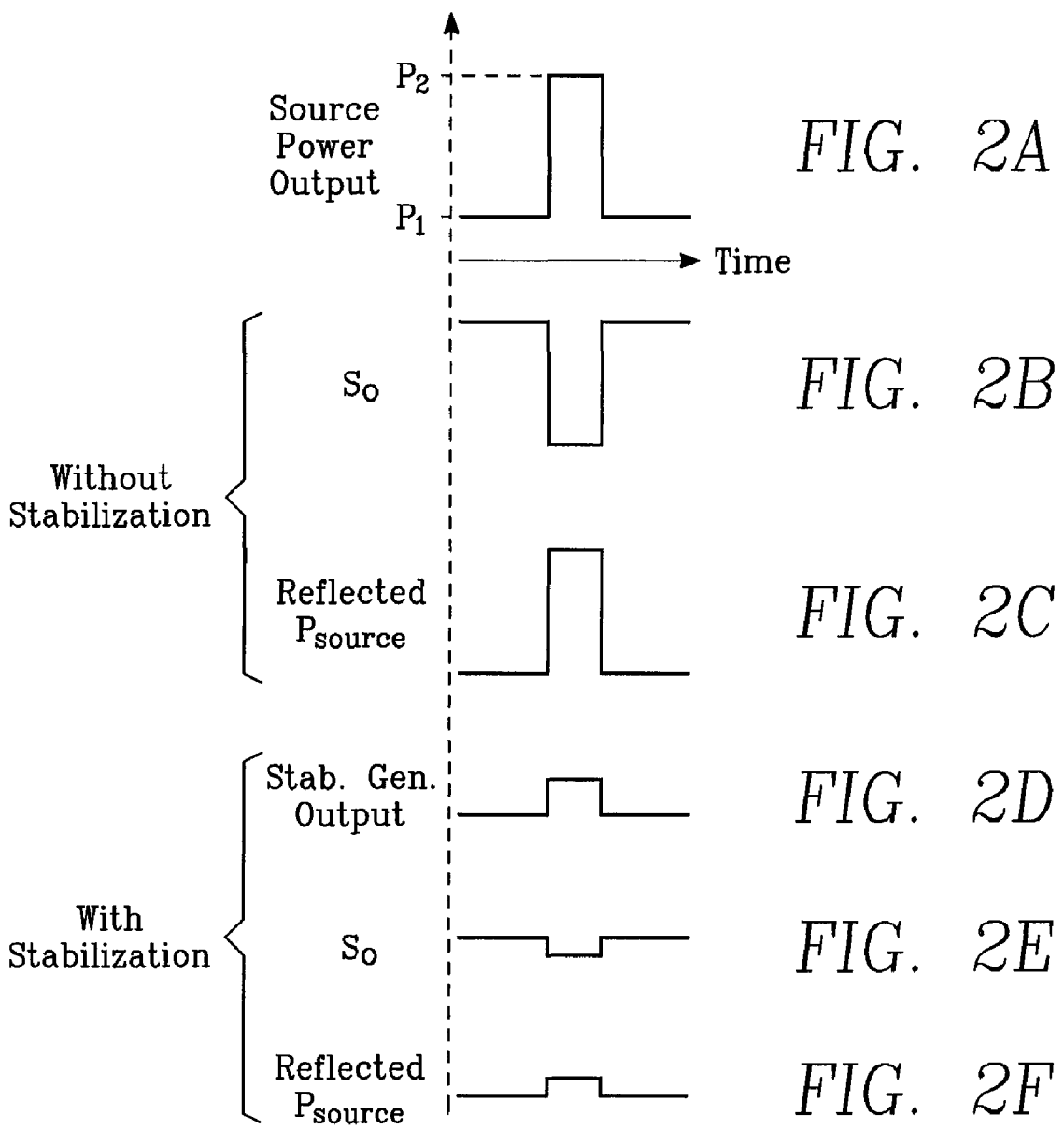

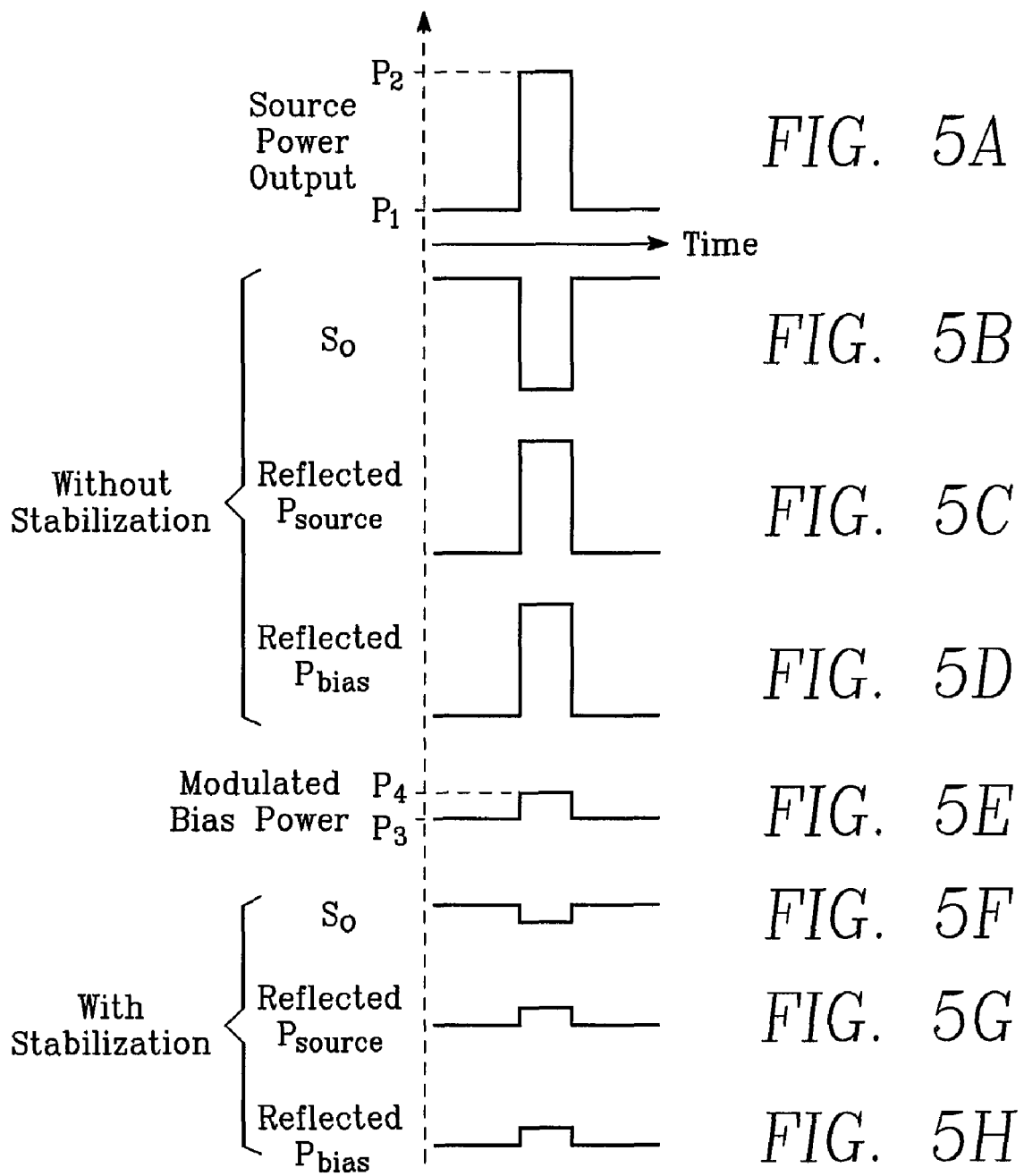

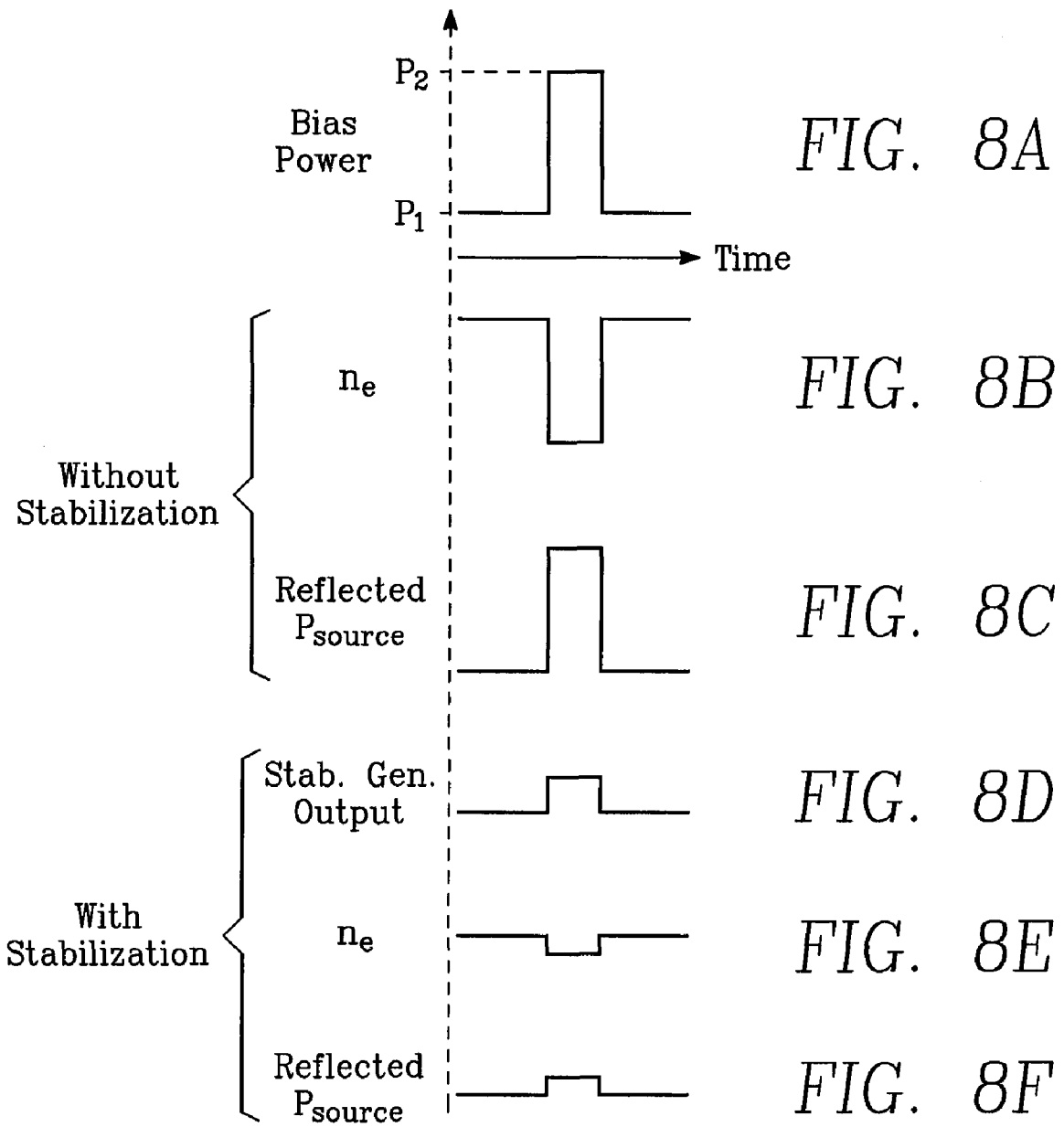

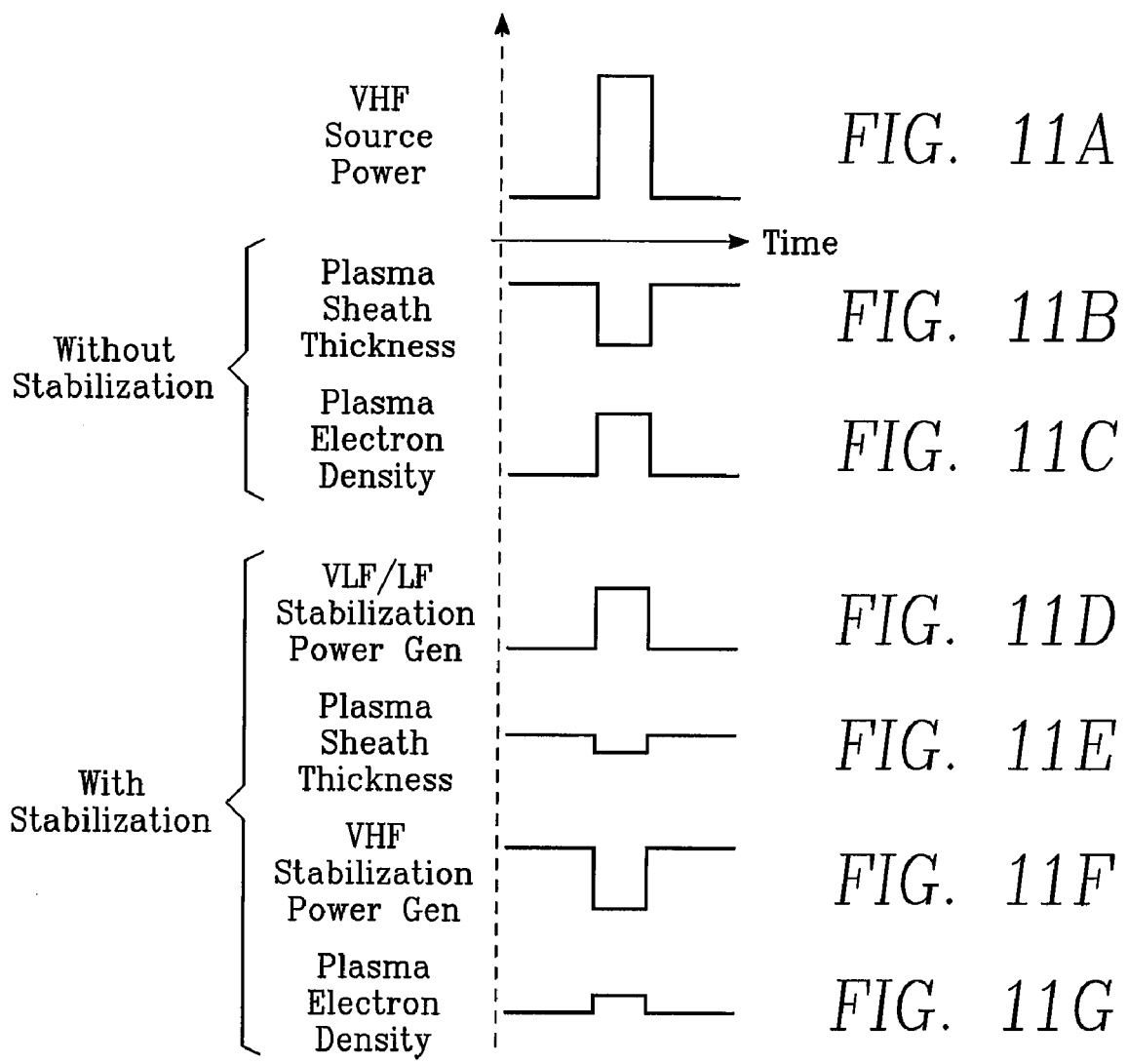

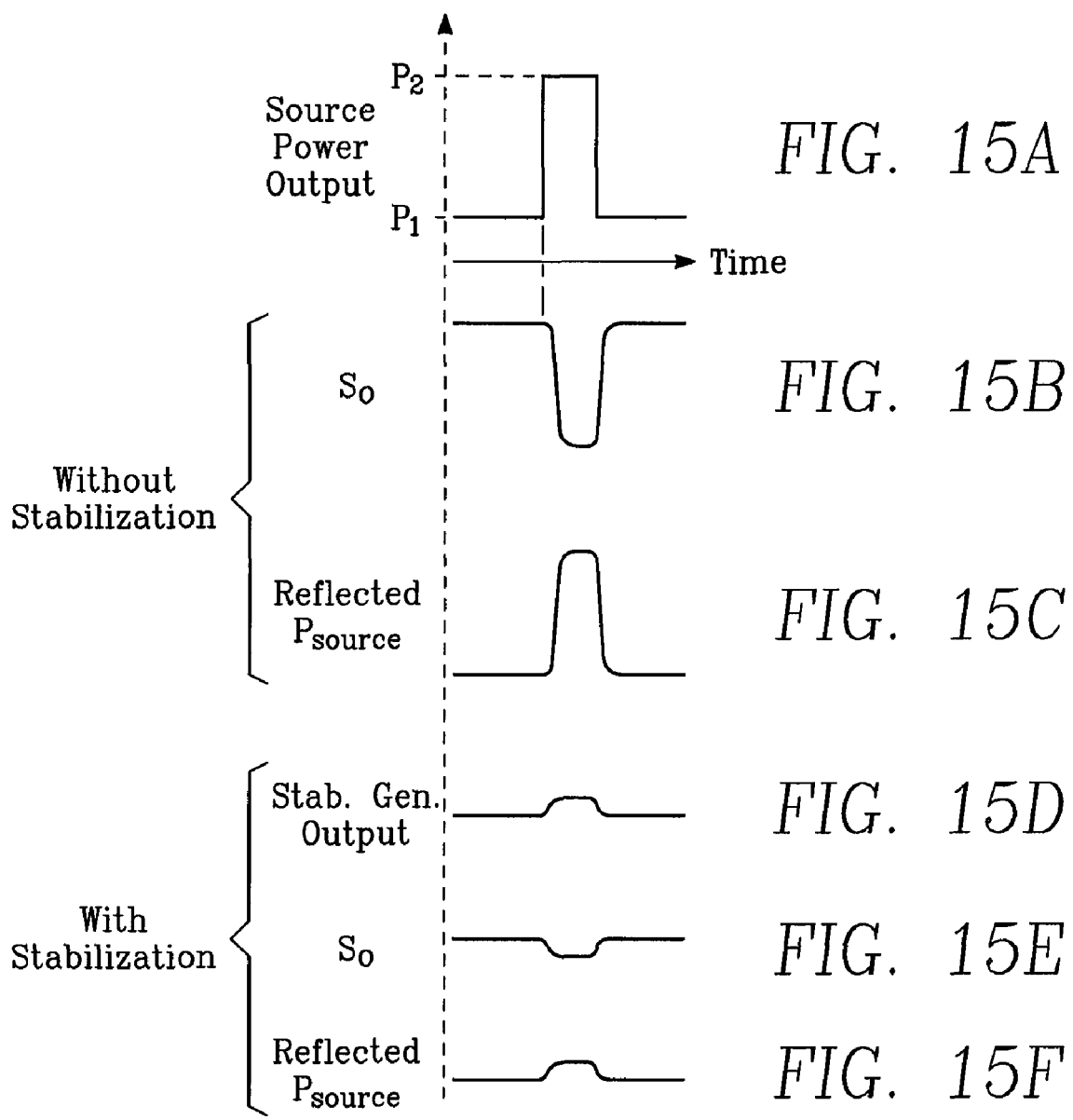

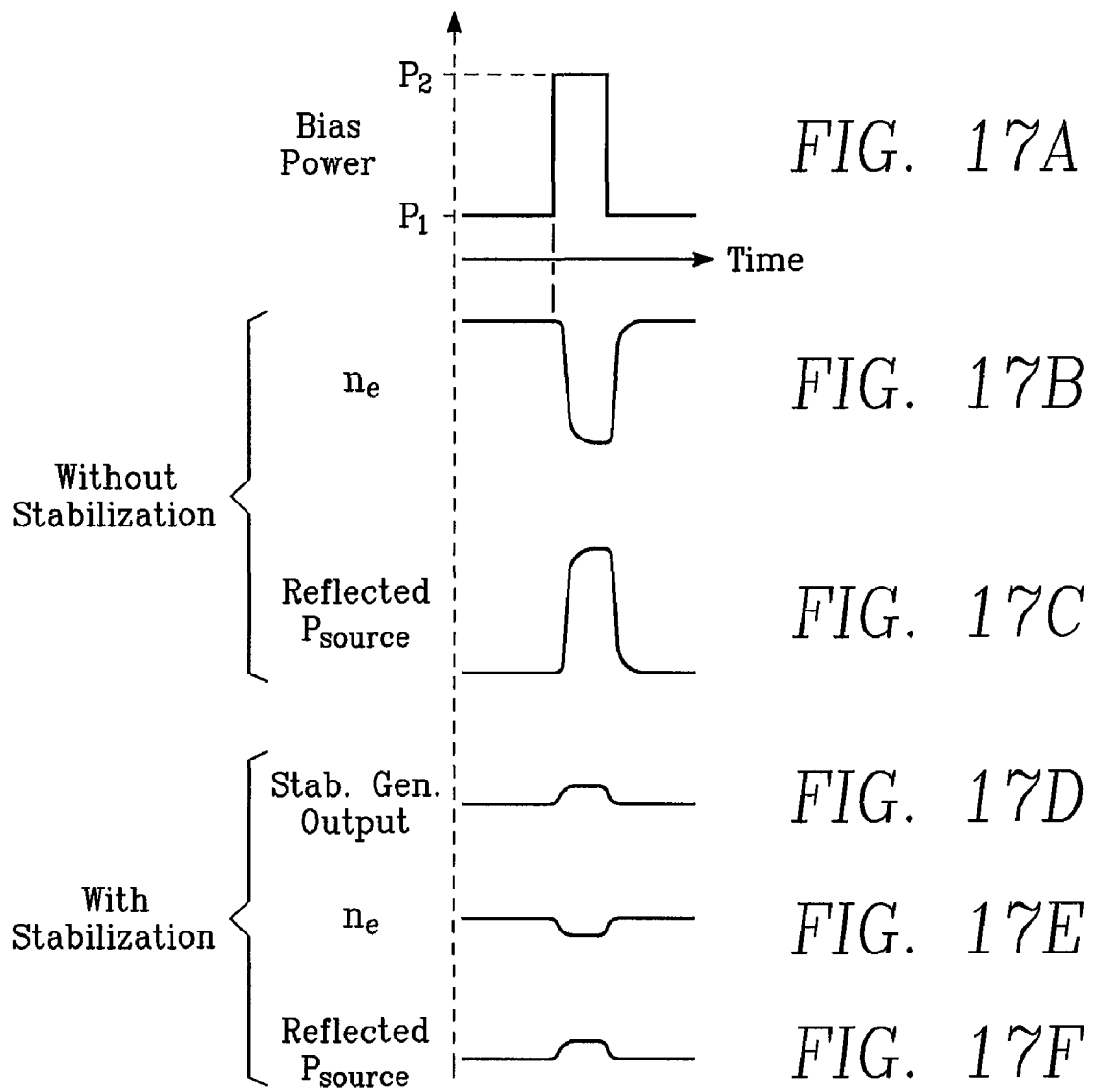

PLASMA REACTOR WITH PLASMA LOAD IMPEDANCE TUNING FOR ENGINEERED TRANSIENTS BY SYNCHRONIZED MODULATION OF A SOURCE POWER OR BIAS POWER RF GENERATOR

BACKGROUND

Plasma processes employed in semiconductor fabrication are constantly being improved in order to make smaller device feature sizes in thin film structures on semiconductor wafers. Currently, feature sizes are in the range of tens of nanometers. The ever decreasing feature sizes are difficult to realize without improvements to various plasma processes used for semiconductor wafers, such as plasma enhanced reactive ion etching, plasma enhanced chemical vapor deposition, plasma enhanced physical vapor deposition and the like.

SUMMARY

A plasma reactor is provided for processing a workpiece. The reactor includes plural impedance matches and plural RF plasma power generators coupled to deliver respective RF plasma powers into the chamber through respective ones of the impedance matches, such as RF plasma source power and RF plasma bias power, for example. The reactor includes a controller for providing a time-varying modulation control signal corresponding to a desired process transient cycle and an amplitude modulator coupled to modulate the output of a first one of the generators in response to the time-varying modulation control signal. A stabilization RF power modulator is coupled to modulate the output of a second one of the generators in response to the time-varying modulation control signal.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

FIGS. 2A through 2F are contemporaneous time domain waveforms depicting operation of the embodiment of FIG. 1A.

FIGS. 5A through 5H are contemporaneous time domain waveforms depicting operation of the embodiment of FIG. 4B.

FIGS. 8A through 8F are contemporaneous time domain waveforms depicting operation of the embodiment of FIG. 6A.

FIGS. 11A through 11G are contemporaneous time domain waveforms depicting operation of the embodiment of FIG. 10.

FIGS. 15A through 15F are contemporaneous time domain waveforms depicting operation of the embodiment of FIG. 1A with the synchronizer follower of FIG. 14.

FIGS. 17A through 17F are contemporaneous time domain waveforms depicting operation of the embodiment of FIG. 6A with the synchronizer follower of FIG. 14.

Figure 1A:
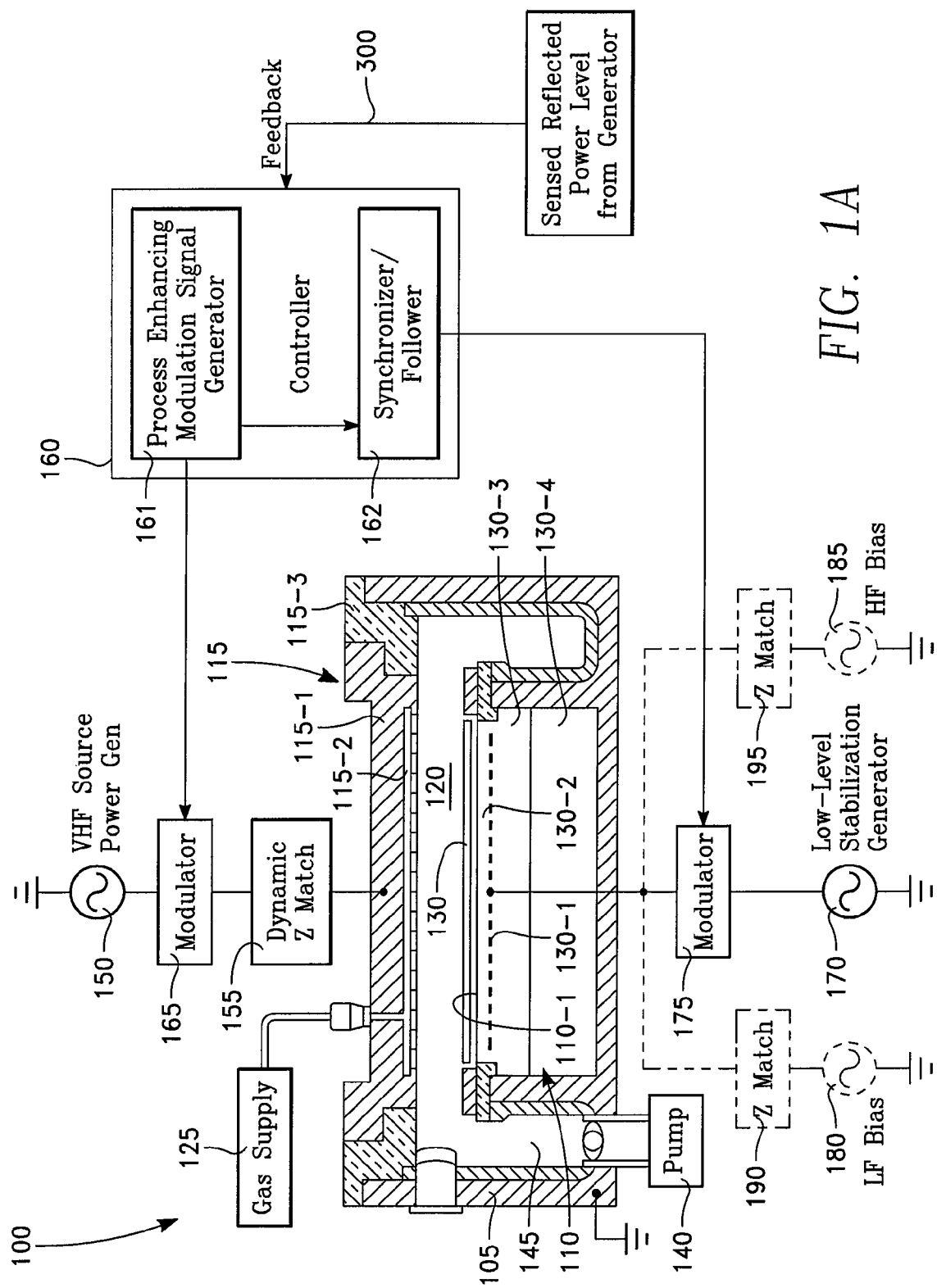
FIGS. 1A and 1B depict embodiments employing a stabilization RF power generator to compensate for engineered transients in the RF plasma source power generator.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Improvements in plasma processing of workpieces or wafers have recently been found by introducing into the plasma processing recipe certain fast changes in plasma conditions (transients) at frequencies as high as 100 kHz. Such fast changes may be referred to as user-induced transients or engineered transients or scheduled perturbations. One example of such a transient is the pulsing or pulse modulation of plasma source power at a pulse repetition rate between 0.1 Hz and 100 kHz. Such pulsing of the plasma source power induces contemporaneous changes in plasma load impedance.

Such changes or transients are automatically followed by the RF impedance match element, so that power reflected back to the RF generator(s) is minimized or remains at an acceptable level. The action of the RF impedance match element in maintaining a constant impedance match for the RF generator is necessary for two reasons. First, the measurement and control of RF power delivered to the plasma must be sufficiently accurate to carry out requirements of the process recipe. Secondly, the RF generator must be protected from damage by reflected RF power (which is caused by an impedance mismatch between the RF generator output and the plasma).

As the pulse rate is increased toward 100 kHz, each RF impedance match element begins to have difficulty following the rapid plasma impedance changes, until, at some threshold frequency near 100 kHz, the impedance match element ceases to function, and provides an impedance mismatch. Upon this occurrence, the power reflected back to the RF generator exceeds an acceptable level, and the reactor is shut down. It has not seemed possible to introduce engineered transients at or near 50-100 kHz or above.

The inability of the impedance match element to follow the higher frequency transients may be attributable to its design. For impedance match elements employing variable reactance elements, the variable reactance elements may have mechanical limitations that slow their response, and typically have response times on the order of one second. For impedance match elements employing tuned frequency generators, the frequency tuning element of such a device may have mechanical limitations that slow their response, and typically have response times on the order of 100 milliseconds. These limitations are inherent in RF impedance match elements, so that it has not seemed possible to stabilize plasma impedance against transients at 50-100 kHz.

Plasma or plasma impedance is stabilized in a plasma process against scheduled perturbations or engineered transients in plasma conditions at high perturbation rates (e.g., as high as 100 kHz or more) without relying upon the reactor's impedance match elements (e.g., variable reactance impedance matches or frequency tuned impedance matches). Instead, stabilization RF power of a selected frequency is applied to the plasma and modulated in synchronism with the engineered transient. Such modulation may be referred to as stabilization modulation or stability modulation. The frequency and power level of the stabilization RF power is such that it opposes the change in plasma impedance otherwise induced by the engineered transient. Generally, the plasma reactor has an RF plasma source power generator coupled to the reactor through an RF impedance match device. It may also have one or more bias power generators coupled to the wafer support through respective impedance match elements. The engineered transient may take the form of pulse modulation of the RF plasma source power generator. An engineered transient or scheduled perturbation of a chosen one of the RF power generators (plasma source power generator or plasma bias power generator) may be produced by applying a time-varying modulation control signal to a modulator coupled to the output of the chosen RF power generator. The time-varying modulation control signal corresponds to the desired engineered transient or scheduled perturbation, and may be produced in a controller provided for this purpose. For example, if the desired engineered transient consists of pulsing of the RF power from the chosen RF power generator, then the time-varying modulation control signal may be a pulse waveform. The engineered transient is not limited to pulsed waveforms, but may have any other desired waveform (e.g., sawtooth, ramped, sinusoidal, and so forth). In some embodiments, the stabilization RF power is obtained from an auxiliary low power RF generator (one or more) coupled to the reactor without an impedance match element. In other embodiments, stabilization RF power is obtained from pre-existing bias power generators or the source power generator. In this case, a selected one (or ones) of the pre-existing generators are amplitude modulated in synchronism with the engineered transient.

The selection of the frequency of the stabilization RF power may be made in accordance with the type of fluctuation in plasma impedance expected to be induced by the engineered transient. For fluctuations in the imaginary component of the plasma impedance (e.g., the capacitance), the stabilization RF power frequency may be an LF frequency that strongly affects plasma sheath thickness. For fluctuations in the real component of the plasma impedance (e.g., the resistance), the stabilization RF power frequency may be a VHF frequency that strongly affects plasma electron density.

As one example, the RF plasma source power generator may be coupled to an overhead electrode of the reactor chamber through an impedance match element, and operate at a VHF frequency (e.g., above 50 MHz) for efficient plasma generation. The engineered transient may include pulsing of the VHF power applied to the overhead electrode. Such an engineered transient may have, as its purpose, modulating the plasma electron density in order to improve some aspect of a plasma process. Such pulsing of the overhead electrode VHF plasma source power may cause the plasma sheath thickness to fluctuate in synchronism with the pulsing. In one example, the overhead electrode VHF source power is pulsed between high and low power levels, in which case the plasma sheath thickness is minimum during the pulse duration of the high power level. This fluctuation in plasma sheath thickness causes the capacitive component of the plasma impedance to fluctuate in similar manner. If the pulse rise time is low and the pulse repetition rate is high (e.g., near 100 kHz), the impedance match element for the VHF plasma source power generator cannot follow the changes in plasma impedance. The frequency of the stabilization RF power (e.g., of the auxiliary RF generator) is selected to oppose any decrease in plasma sheath thickness during each pulse duration of the high power level. In one embodiment, the auxiliary RF power generator produces an LF frequency, which is ideal for increasing the plasma sheath thickness or, in the present case, opposing its decrease during each source power pulse duration. If such an auxiliary RF power generator is employed, then it is synchronized with the pulse modulation of the engineered transient, and its output is coupled to the reactor at the wafer support or at the overhead ceiling.

As another example, an RF plasma bias power generator (separate from the RF plasma source power generator) may be coupled to an electrode in the wafer support within the reactor chamber through an impedance match element, and operate at an LF frequency (e.g., below 1 MHz) for control of plasma sheath voltage and ion energy. The engineered transient may include pulsing of the LF power applied to the wafer support electrode. Such an engineered transient may have, as its purpose, the modulating of the plasma sheath voltage to improve some aspect of the plasma process. Such pulsing of the wafer support electrode LF plasma bias power may cause the plasma electron density to fluctuate in synchronism with the pulsing. In one example, the LF bias power is pulsed between high and low power levels, in which case the plasma electron is minimum during the pulse duration of the high power level. This fluctuation in plasma electron density causes the resistive component of the plasma impedance to fluctuate in similar manner. If the pulse rise time is low and the pulse repetition rate is high (e.g., near 100 kHz), the impedance match elements for the source power generator and the bias power generator cannot follow the changes in plasma impedance. The frequency of the stabilization RF power (e.g., of the auxiliary RF generator) is selected to oppose any decrease in plasma electron density during each pulse duration of the high power level. In one embodiment, the auxiliary RF power generator produces a VHF frequency, which is ideal for increasing the plasma electron density or, in the present case, opposing its decrease during each bias power pulse duration. If such an auxiliary RF power generator is employed, then it is synchronized with the pulse modulation of the engineered transient, and its output is coupled to the reactor at the overhead ceiling or at the wafer support electrode.

In further embodiments, plural stabilization generators of different frequencies coupled to the reactor are synchronized with the engineered transient in cases where the engineered transients change more than one plasma parameter. For example, both an LF stabilization source and an HF or VHF stabilization source may be employed in concert to oppose transient-induced changes in both plasma sheath thickness and in plasma electron density. As one example in which the engineered transient includes pulsing the plasma RF source power between high and low levels, LF stabilization power is applied to the plasma during each high pulse duty cycle in order to oppose a decrease in plasma sheath thickness caused by increased source power level. And, VHF stabilization power is applied to the plasma during each low pulse duty cycle to oppose a decrease in plasma electron density caused by decreased source power level. In this example, the LF and VHF stabilization power waveforms may be of opposing phases.

FIG. 1A depicts an embodiment in which a plasma process recipe calls for pulsing the plasma source power at a desired pulse rate and pulse width. The reactor in this embodiment includes a reactor chamber 100 having a cylindrical side wall 105 which may be a conductor, a workpiece support 110 and a ceiling 115 defining a processing volume 120. The ceiling 115 includes an electrode 115-1 having a gas distribution showerhead 115-2 on its bottom surface fed by a gas supply 125, and an insulating ring 115-3 separating the electrode 115-1 from the sidewall 105. The workpiece support 110 has a workpiece support surface 110-1 supporting a workpiece 130 which may be a semiconductor wafer, for example. The workpiece support has an electrode 130-1 encapsulated within an insulating layer that includes an upper insulating layer 130-2 between the electrode 130-1 and the workpiece support surface 110-1 and a lower insulating layer 130-3 beneath the electrode 130-1. The lower insulating layer 130-3 is supported on a conductive base 130-4. A vacuum pump 140 evacuates the chamber 100 through a pumping annulus 145 defined between the workpiece support 110 and the sidewall 105.

Plasma source power is applied to the ceiling electrode 115-1 from a VHF plasma source power generator 150 through a dynamic impedance match circuit 155. The desired engineered transient is produced by a controller 160. Specifically, the controller 160 includes a process-enhancing modulation signal generator 161 that generates a time-varying modulation control signal in accordance with the desired transient defined by a process recipe selected by the user. A transient modulator 165 at the output of the VHF plasma source power generator 150 modulates the amplitude or power level of the generator output in response to the time-varying modulation control signal from the control signal generator 161. The action of the transient modulator 165 in response to the time-varying modulation control signal from the signal generator 161 produces the desired transient in the output of the VHF plasma source power generator 150. FIG. 2A depicts an example in which a single transient is introduced. The transient may be any sort of modulation, such as (for example) ramp modulation, sawtooth modulation, exponential burst modulation or pulse modulation or any transient or modulation having a Fourier component of at least 10 Hz. In the example of FIG. 2A, the transient is a single pulse, although the transient or modulation may be repeated. If the time-varying modulation control signal is a single pulse, then the VHF generator modulator 165 produces the output power waveform depicted in FIG. 2A. In one example, the VHF plasma source power is pulsed between two power levels $P_1$ and $P_2$, as depicted in FIG. 2A. In another unillustrated example, in which the modulation is repetitive, the duty cycle of the lower power level may be longer than that of the higher power level. As plasma power is increased during the high power level duty cycle, the resulting increase in plasma electron density depresses the plasma sheath thickness in synchronism with the pulsed waveform, as depicted in FIG. 2B. This raises the capacitive component of the plasma impedance in synchronism with the pulse waveform. If the pulse repetition rate is too fast for the impedance match to follow, the sudden changes in plasma impedance cause an impedance mismatch and consequent increase in power reflected back to the VHF generator 150 in synchronism with the pulsed waveform, as depicted in FIG. 2C.

In order to avoid an increase in reflected source power, a low power auxiliary or stabilization RF generator 170 is coupled to the chamber 100, specifically to the wafer support electrode 130-1, through a follower modulator 175. No impedance match is provided for the stabilization generator 170, since its purpose is to respond to a transient whose speed is beyond the capability of an impedance match circuit. The controller 160 includes a synchronizer or follower 162 that generates a stabilization control signal controlling the follower modulator 175 in response to the output of the control signal generator 161. The stabilization control signal from the follower 162 is responsive to the time-varying modulation control signal from the generator 161. In one simplified embodiment, the two control signals may be the same signal. The follower modulator 175 produces a pulsed RF waveform depicted in FIG. 2D. In one embodiment, the RF frequency of the stabilization power generator 170 is a low frequency or very low frequency that strongly influences the plasma sheath thickness, so as to oppose its reduction during each pulse duty cycle of the source power. The result is that the plasma sheath thickness reduction during each pulse duty cycle is greatly reduced, as depicted in FIG. 2E, which reduces the change in plasma capacitance and thereby reduces the impedance mismatch and the VHF power reflected back to the VHF generator 150, as depicted in FIG. 2F.

The frequency of the stabilization RF power generator 170 is selected to be sufficiently low (e.g., from several MHz to as low as a several kHz) to efficiently change plasma sheath thickness. At such a low frequency, the power level of the stabilization RF generator 170 may be a fraction of the power level of the source power generator 150, and depends at least in part upon the degree of modulation of the source power by the modulator 165. In one example, if the proportion between the high and low source power levels $P_2$ and $P_1$ of FIG. 2A is about 50%, and if $P_1$ is several kilowatts, only several hundred Watts may be required from the stabilization RF generator 170 to adequately reduce reflected power. At an optimum modulation or amplitude level of the stabilization RF power generator 170, the change in plasma impedance associated with each cycle of the engineered transient is minimized or nullified, so that plasma load impedance changes very little if at all. This optimum power level or degree of modulation of the stabilization RF power generator 170 can be determined by trial and error for the chosen engineered transient, or can be optimized in a feedback control loop described later in this specification.

As depicted in dashed line in FIG. 1A, the reactor optionally may further include one or more RF plasma bias power generators 180, 185 coupled to the wafer support electrode 130-1 through respective impedance matches 190, 195. The two bias power generators may have different frequencies suitable for adjusting the electron energy distribution function at the surface of the workpiece. For example, the bias power generator 180 may be an LF power generator while the bias power generator 185 may be an VLF or HF power generator. The reflected power at each of the bias generators 180, 185 may be improved by using the stabilization power generator 170 in a manner similar to that discussed above with reference to FIGS. 2A through 2F. As employed in this specification, VHF refers to frequencies in a range of 30-300 MHz and HF refers to frequencies in a range of 3-30 MHz. As used in this specification, LF refers to both middle frequencies (300 kHz to 3 MHz) and low frequencies (30-300 kHz), and VLF refers to frequencies below 30 kHz. In general, in the upper portion of the VHF range (e.g., above 150 MHz), 80% or more of the RF power contributes to plasma electron generation or plasma electron density. In the lower portion of the LF range defined above (e.g., below 2 MHz), 80% or more of the RF power contributes to plasma sheath thickness or sheath voltage.

Figure 1B:
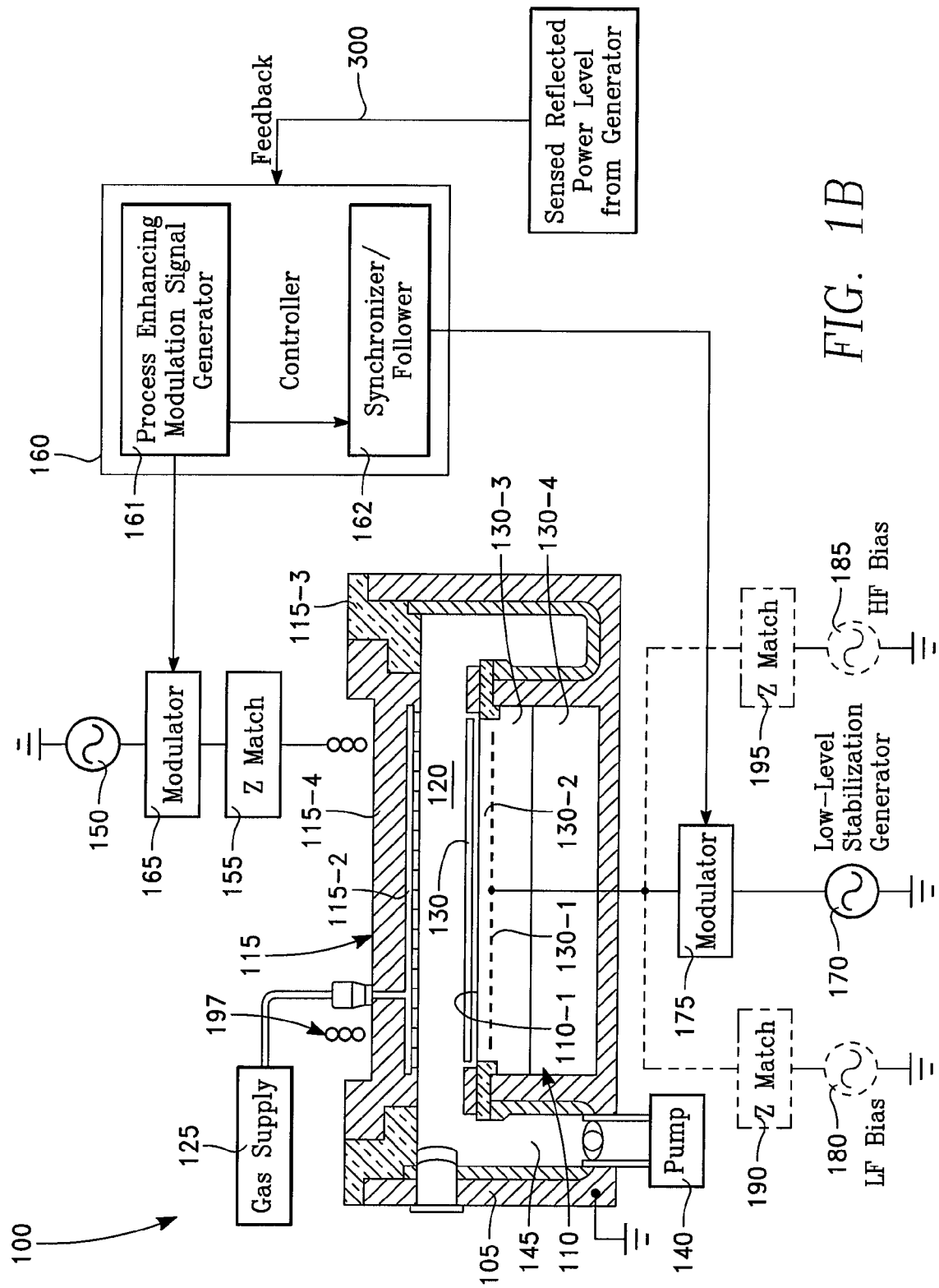

FIG. 1B depicts a modification of the embodiment of FIG. 1A, in which the overhead electrode 115-1 is replaced by a dielectric ceiling 115-4, and an inductive coil antenna 197 receives the RF source power from the generator 150 through the impedance match 155. The plasma is generated by inductive coupling, in which case the frequency of the source power generator 150 may be in the HF or LF range rather than VHF. However, modulation of the LF or HF source power applied to the coil antenna 197 in the inductively coupled plasma source of FIG. 1B has essentially the same effect as modulation of the VHF power in the capacitively coupled reactor of FIG. 1A. The stabilization generator 170 operates in the same manner in the reactor of FIG. 1B as in the reactor of FIG. 1A to reduce reflected RF power.

Figure 3A:
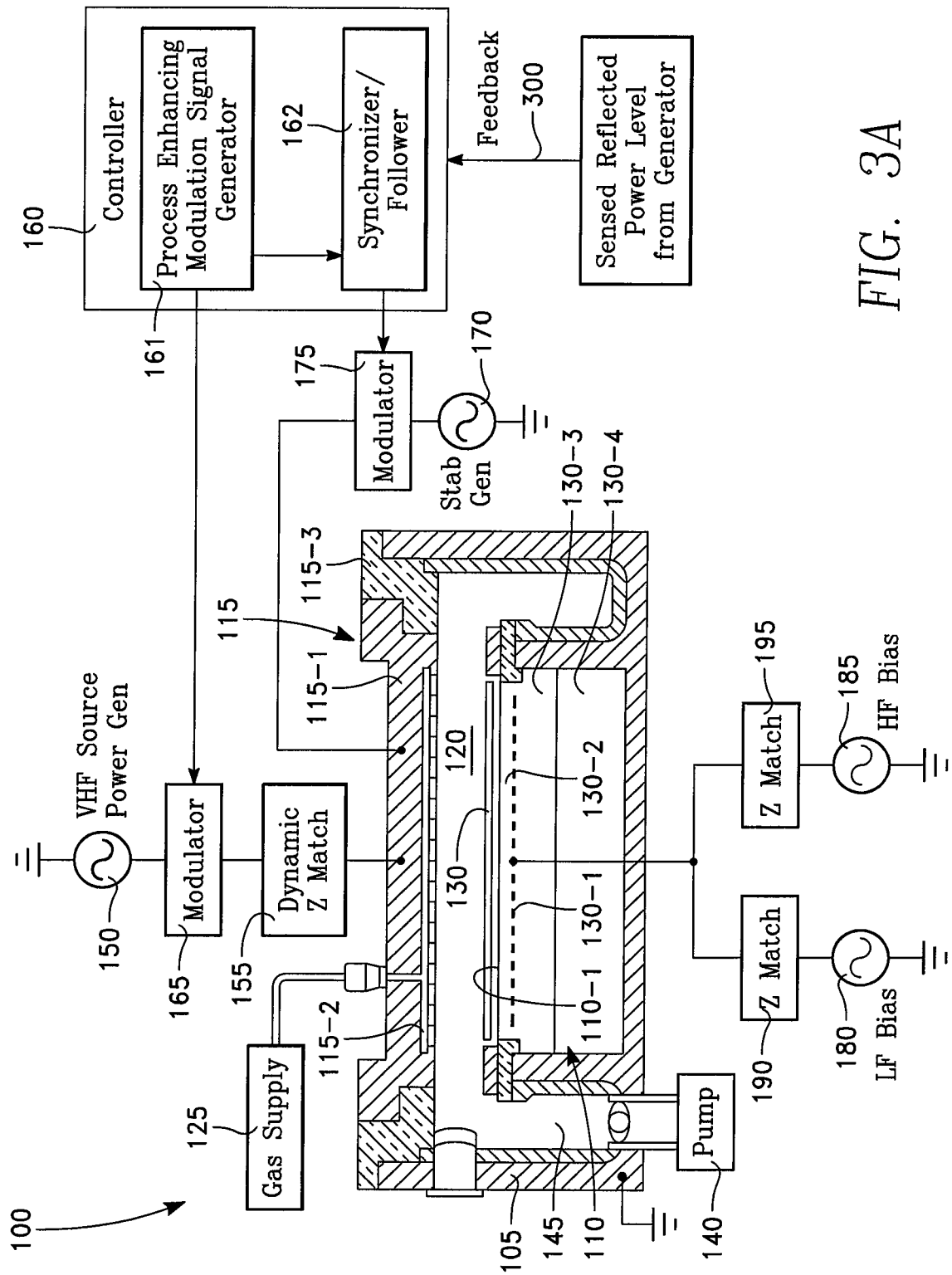
FIGS. 3A through 3C depict embodiments in which stabilization RF power is applied to a ceiling electrode.

FIG. 3A depicts an embodiment in which the output of the stabilization generator 170 and modulator 175 are applied to the ceiling electrode 115-1 rather than the wafer support electrode 130-1.

Figure 3B:
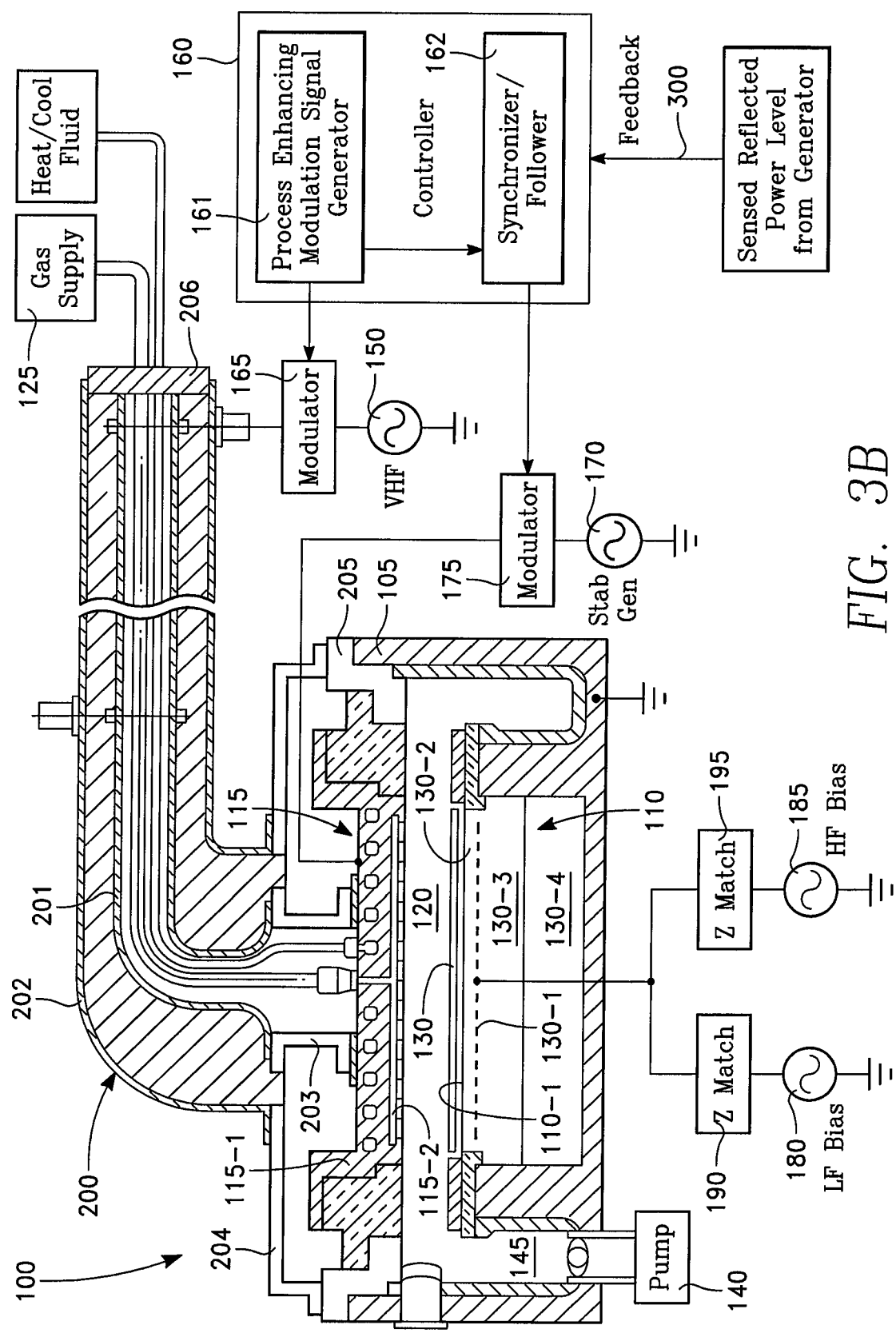

FIG. 3B depicts a similar embodiment, but in which the dynamic impedance match 155 has been replaced by a fixed impedance match element, such as a coaxial tuning stub 200. The coaxial tuning stub 200 has coaxial hollow inner and outer conductors 201, 202, the inner conductor 201 being coupled to the ceiling electrode 115-1 through a conductive ring 203, and the outer conductor 202 being coupled to the chamber sidewall 105 through conductive rings 204, 205. A conductor disk 206 at the far end of the coaxial stub 200 shorts the inner and outer conductors 201, 202 together. The VHF source power generator 150 is connected across the inner and outer coaxial conductors at a predetermined location along the length of the coaxial tuning stub 200. The gas supply 125 is connected via conduits to the gas distribution showerhead 115-2 through the hollow interior of the inner conductor 201. In this embodiment, the stabilization power generator 170 reduces RF power reflected back to the bias power generators 180, 185.

Figure 3C:
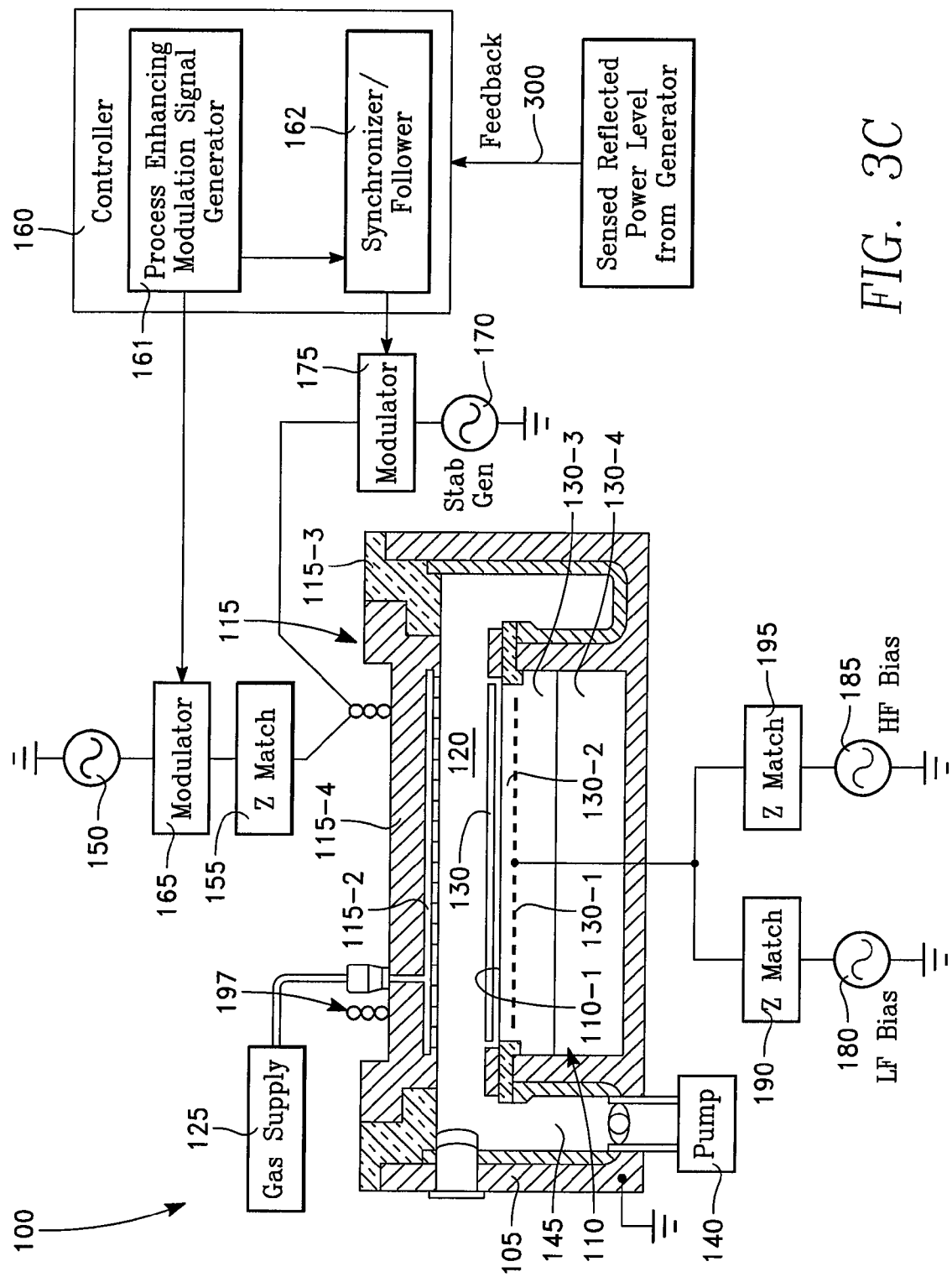

FIG. 3C depicts a modification of the reactor of FIG. 3A, in which the overhead electrode 115-1 is replaced by a dielectric ceiling 115-4, and an inductive coil antenna 197 overlying the ceiling 115 receives the RF source power from the generator 150 through the impedance match 155. The plasma is generated by inductive coupling, in which case the frequency of the source power generator 150 may be in the HF or LF range rather than VHF. The output of the stabilization power generator 170 and its modulator 175 may be coupled directly to the coil antenna 197, as depicted in the drawing, in which case the stabilization power generator 170 may be an HF or LF generator to have the desired effect upon plasma electron density. Alternatively, the ceiling 115 may include an overhead electrode (not shown) that is nearly transparent to the coil antenna 197, such as a Faraday shield for example, and the stabilization generator modulator 175 is connected to this overhead electrode. In this alternative case, the frequency of the stabilization generator 170 is a VHF frequency in order to affect plasma electron density through capacitive coupling.

Figure 4A:
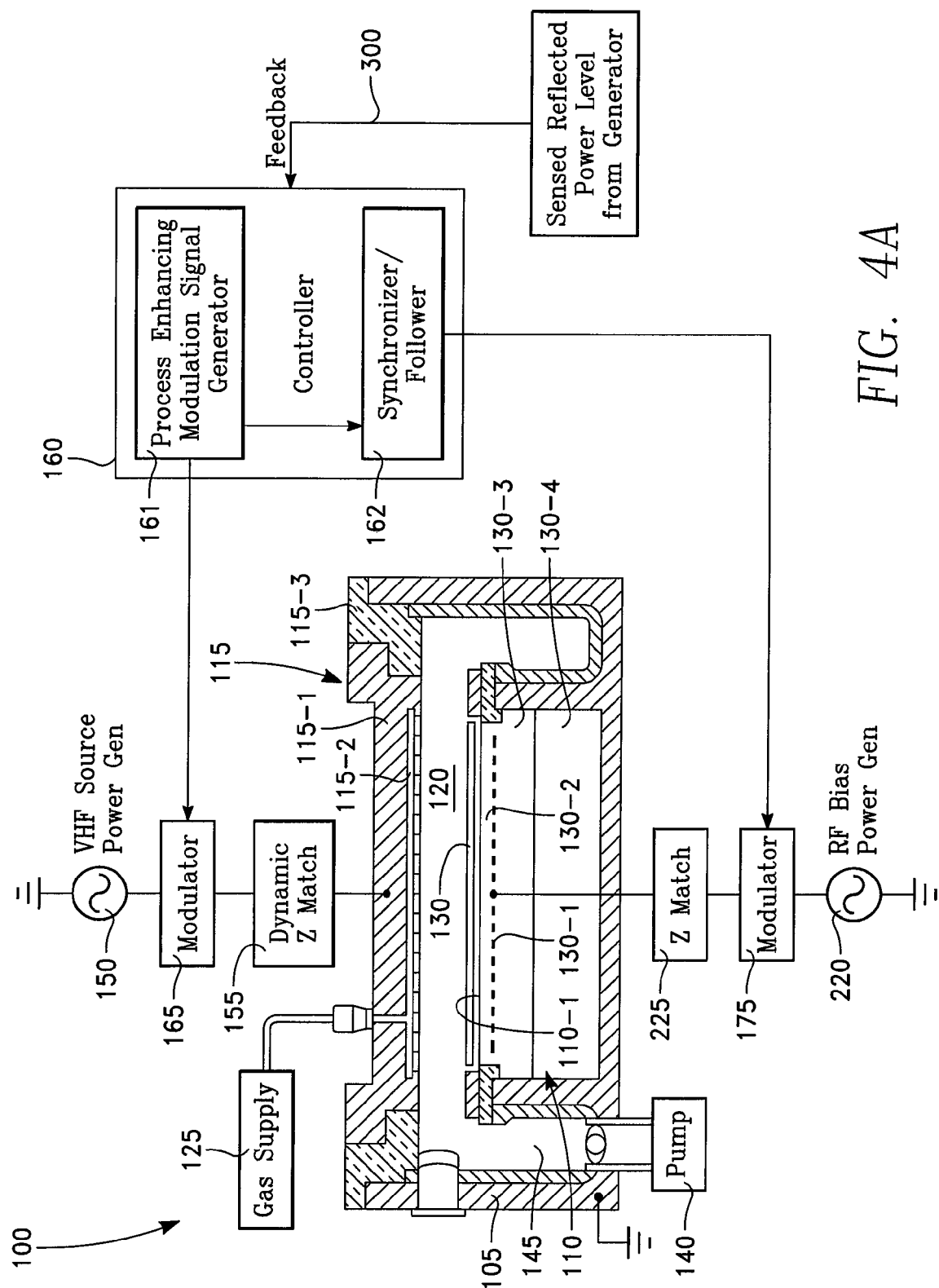
FIGS. 4A through 4D depict embodiments in which stabilization RF power is obtained by modulating an existing bias power generator.

FIG. 4A depicts an embodiment in which stabilization power is provided by modulating power from a pre-existing bias power generator. This obviates the need to provide a dedicated stabilization RF power generator, such as the stabilization power generator 170 of FIG. 1A. In the embodiment of FIG. 4A, the reactor includes an RF bias power generator 220 (which may be a high power RF generator) coupled to the workpiece support electrode 130-1 through an impedance match circuit 225. In the embodiment of FIG. 4A, the modulator 175 controls the output of the bias power generator 220 in such a way as to stabilize the plasma impedance against the engineered transients in the source power. In one example, the modulator 175 may impose less than 100% modulation of the RF bias power. Modulation of the bias power generator 220 in FIG. 4A output may have the same effect as the provision of the stabilization power generator 170 in FIG. 1. The bias power generator 220 may produce very high power level (e.g., in the range of kilowatts), and therefore the desired stabilization effect may be obtained by only a small modulation (e.g., 5%) of the output of the bias power generator 220.

Figure 4B:
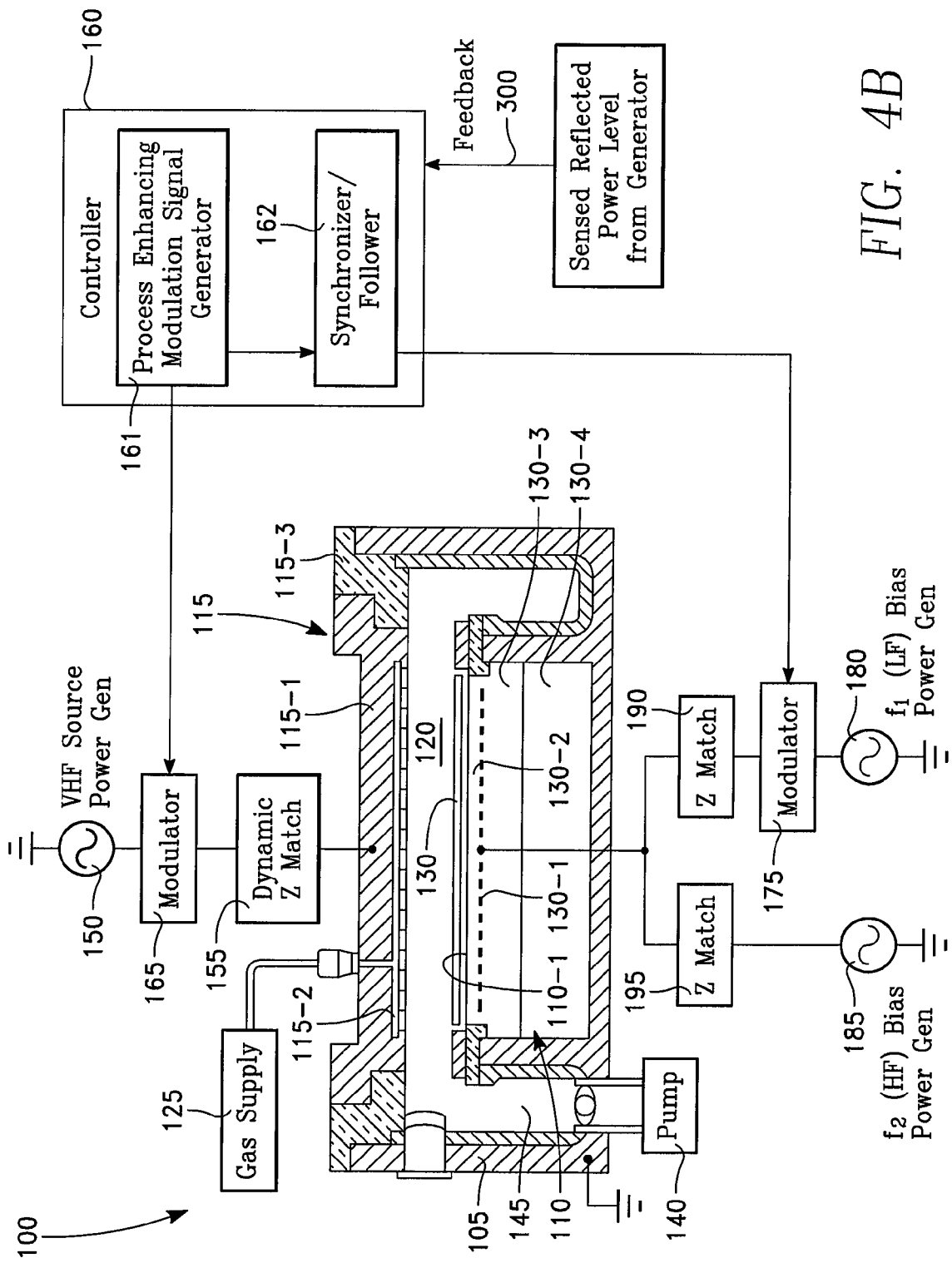

FIG. 4B depicts a modification of the reactor of FIG. 4A, in which there are plural RF bias power generators of different frequencies coupled to the wafer support electrode 130-1, which is a feature useful for selecting the ion energy distribution function. In the illustrated embodiment, there are two bias power generators, 180, 185, coupled to the wafer support electrode 130-1 through respective impedance match circuits 190, 195. The RF bias generators 180, 185 may for example be LF and HF generators, respectively. One of the two generators 180, 185 is selected to supply the stabilization RF power, which in the illustrated example is the LF bias power generator 180. In the embodiment of FIG. 4B, the modulator 175 is coupled to the output of the LF bias power generator 180, and imposes a modulation (e.g., pulse modulation) of the RF power output of the generator 180 for RF power stabilization of the plasma impedance. In one example, the modulator 175 of FIG. 4B may impose less than 100% modulation of the RF bias power. Modulation of the bias power generator 180 in FIG. 4B output may have the same effect as the provision of the stabilization power generator 170 in FIG. 1A. The bias power generator 180 may produce a very high power level (e.g., in the range of kilowatts), and therefore the desired stabilization effect may be obtained by only a small modulation (e.g., 5%) of the output of the bias power generator 180.

FIG. 5A depicts the time domain waveform of the output of the source power generator 150 in the reactor of FIG. 4B. The pulsed shape of this waveform corresponds to a desired engineered transient produced by the controller 160 and source power modulator 165. FIG. 5A depicts an example in which a single transient is introduced. The transient may be any sort of modulation, such as (for example) ramp modulation, sawtooth modulation, exponential burst modulation or pulse modulation or any transient or modulation having a Fourier component of at least 10 Hz. In the example of FIG. 5A, the transient is a single pulse, although the transient or modulation may be repeated. FIG. 5B depicts the behavior of the plasma sheath thickness responsive to the engineered transient in source power. FIGS. 5C and 5D depict the large excursions in RF power reflected back to the source power generator 150 and to the bias power generator 190, respectively, in the absence of any stabilization. FIG. 5E depicts the output of the bias power generator 180 as modulated by the modulator 175 as a stabilizing influence upon plasma impedance and a countervailing influence against impedance fluctuations due to the engineered transient. As shown in FIG. 5E, stabilization is attained by modulating the bias power between two power levels, $P_3$ and $P_4$. The change between these two power levels may correspond to 5-10% modulation, for example. FIG. 5F depicts the reduced fluctuation in plasma sheath thickness obtained with the stabilizing modulation of the bias power depicted in FIG. 5E. FIGS. 5G and 5H depict the reduced fluctuations in RF power reflected back to the source power generator 150 and to the bias power generator 190, respectively, obtained with the power stabilization of the plasma impedance.

Figure 4C:
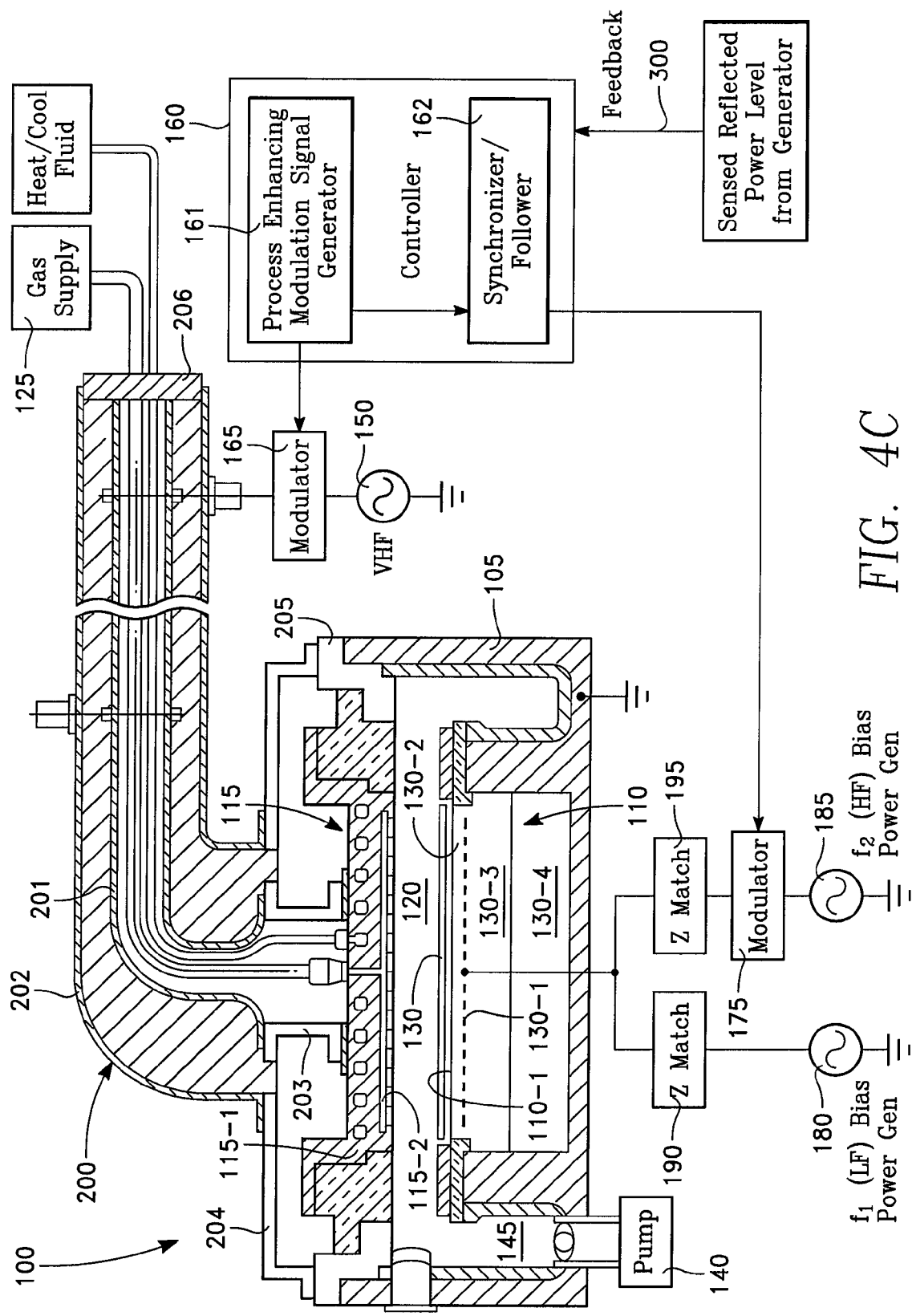

FIG. 4C depicts a modification of the reactor of FIG. 4B in which the dynamic impedance match 155 has been replaced by a fixed impedance match element, such as the coaxial tuning stub 200 of FIG. 3B, which is described above.

Figure 4D:
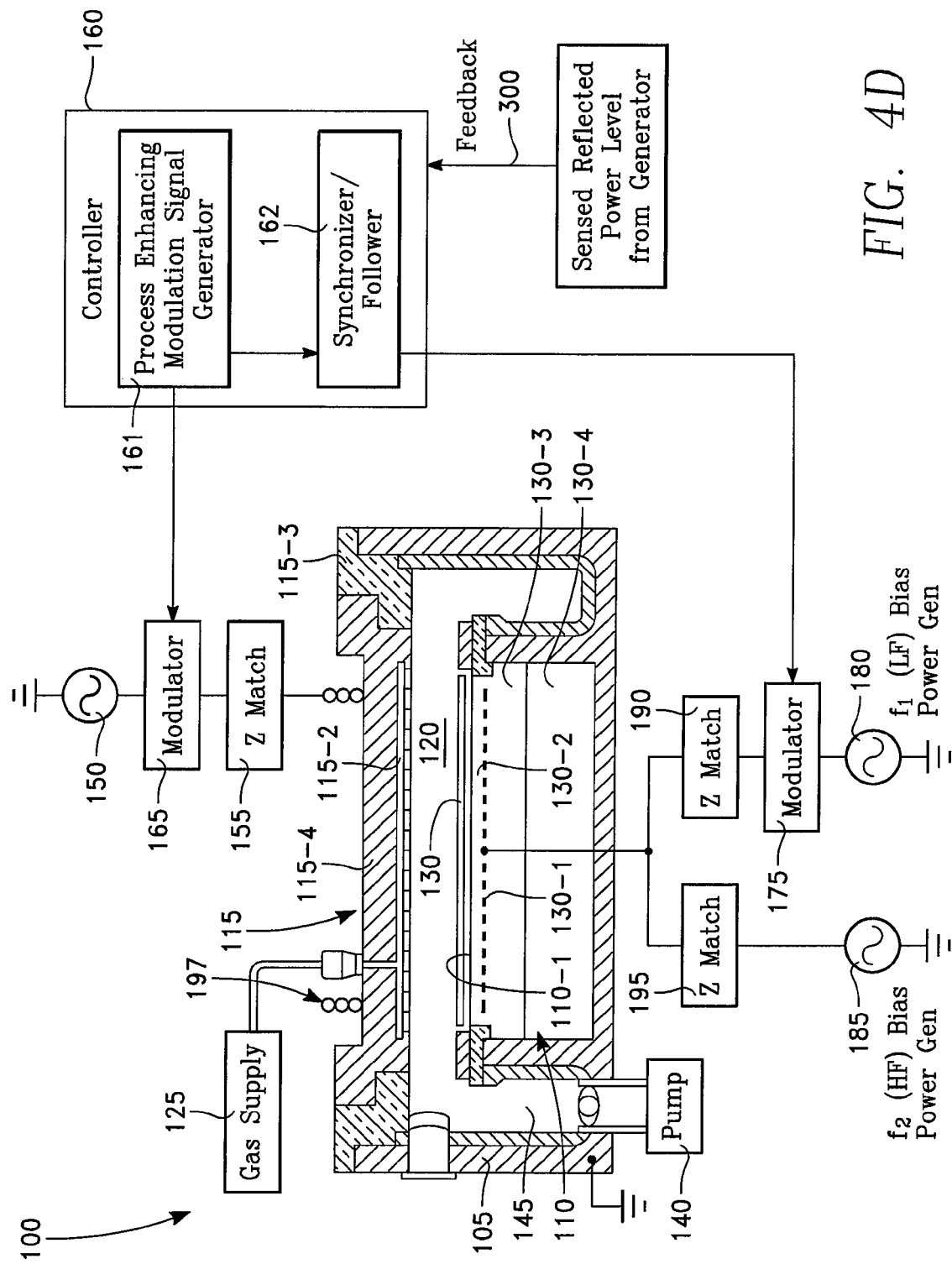

FIG. 4D depicts another modification of the reactor of FIG. 4B, in which the overhead electrode 115-1 is replaced by a dielectric ceiling 115-4, and an inductive coil antenna 197 overlying the ceiling 115 receives the RF source power from the generator 150 through the impedance match 155. The plasma is generated by inductive coupling, in which case the frequency of the source power generator 150 may be in the HF or LF range rather than VHF. However, modulation of the LF or HF source power applied to the coil antenna 197 in the inductively coupled plasma source of FIG. 4D has essentially the same effect as modulation of the VHF power in the capacitively coupled reactor of FIG. 1A. The primary effect is to create the desired engineered transient (e.g., pulsed source power) that improves an aspect of the plasma process. A secondary but undesired effect is to change plasma impedance faster than the capability of the impedance match (e.g., the impedance match 155 or 190 or 195), so that an impedance mismatch arises which increases reflected RF power (to one or more of the generators 150, 180, 185) to unacceptable levels. The modulation of the output of the RF bias power generator 180 produces the desired stabilization of the plasma impedance (by opposing changes in the plasma sheath thickness). This reduces reflected RF power caused by the engineered transient.

Figure 6A:
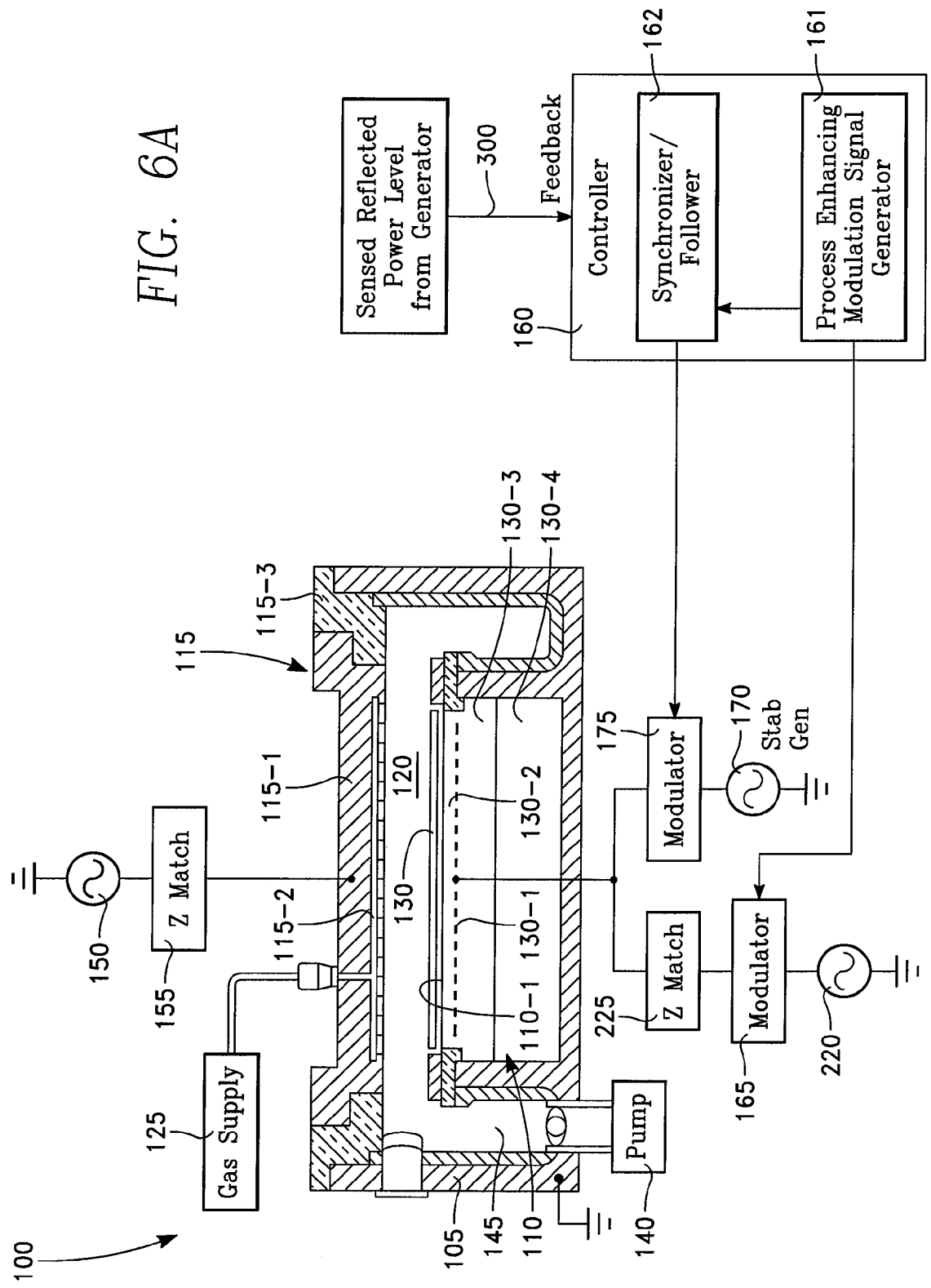
FIGS. 6A, 6B, 7A and 7B depict embodiments in which an engineered transient is obtained by modulating the plasma RF bias power and a stabilization RF power generator is employed.

The foregoing embodiments included examples in which the engineered transient was obtained by modulating (e.g., pulse-modulating) the RF plasma source power generator 150. In other processes, however, the desired engineered transient may be obtained by modulating an RF plasma bias power generator rather than the plasma source power. One reactor of this type of embodiment is depicted in FIG. 6A, which is a modification of the embodiment of FIG. 4A. In the reactor of FIG. 6A, the modulator 165 (controlled by the process enhancing modulation signal generator 161) is coupled to the output of the RF plasma bias power generator 220 to produce the engineered transient in RF bias power. Plasma is generated, as in other embodiments herein, by the VHF source power generator 150 driving the ceiling electrode 115-1 through the impedance match 155. The impedance match 155 may be either a dynamic impedance match (e.g., a variable reactance-tuned impedance match or a frequency-tuned impedance match) or a fixed impedance match. The engineered transient may, for example, involve any degree of modulation of the bias power, up to and including 100% modulation (in which the bias power is pulsed on and off) or a modest degree of modulation (in which the bias power is pulsed between two different power levels). The degree of modulation is determined by the controller 160 in accordance with a predetermined process recipe.

In the reactor of FIG. 6A, the plasma impedance is stabilized against fluctuations induced by the engineered transient. The stabilization RF power generator 170 is coupled through the modulator 175 to the wafer support electrode 130-1 without an impedance match between the stabilization generator 170 and the wafer support electrode 130-1. The RF bias power generator 220 is, typically, either an LF generator (e.g., having a frequency in the kHz range or a few MHz) or an HF generator (e.g., having a frequency from several MHz up to about 30 MHz). The engineered transient (e.g., pulsing) of the RF bias power has the primary effect of changing the plasma sheath thickness. It has a secondary effect of changing the plasma electron density, dropping the density with each pulse in bias power. In order to oppose such drops in plasma density, the stabilization RF power generator 170 has VHF frequency (or a frequency that is highly efficient in generating plasma electrons). If the transient modulator 165 imposes pulse modulation on the bias power generator 220, then the follower modulator 175 imposes a corresponding pulse modulation of the stabilization RF power generator 170. The pulsed output of the stabilization RF power generator 170 opposes reduction in the plasma sheath thickness that would be caused by the pulsing of the bias power generator 220. The plasma sheath thickness fluctuations are thereby reduced, which reduces impedance mismatching between the plasma and the source power generator 150.

Figure 6B:
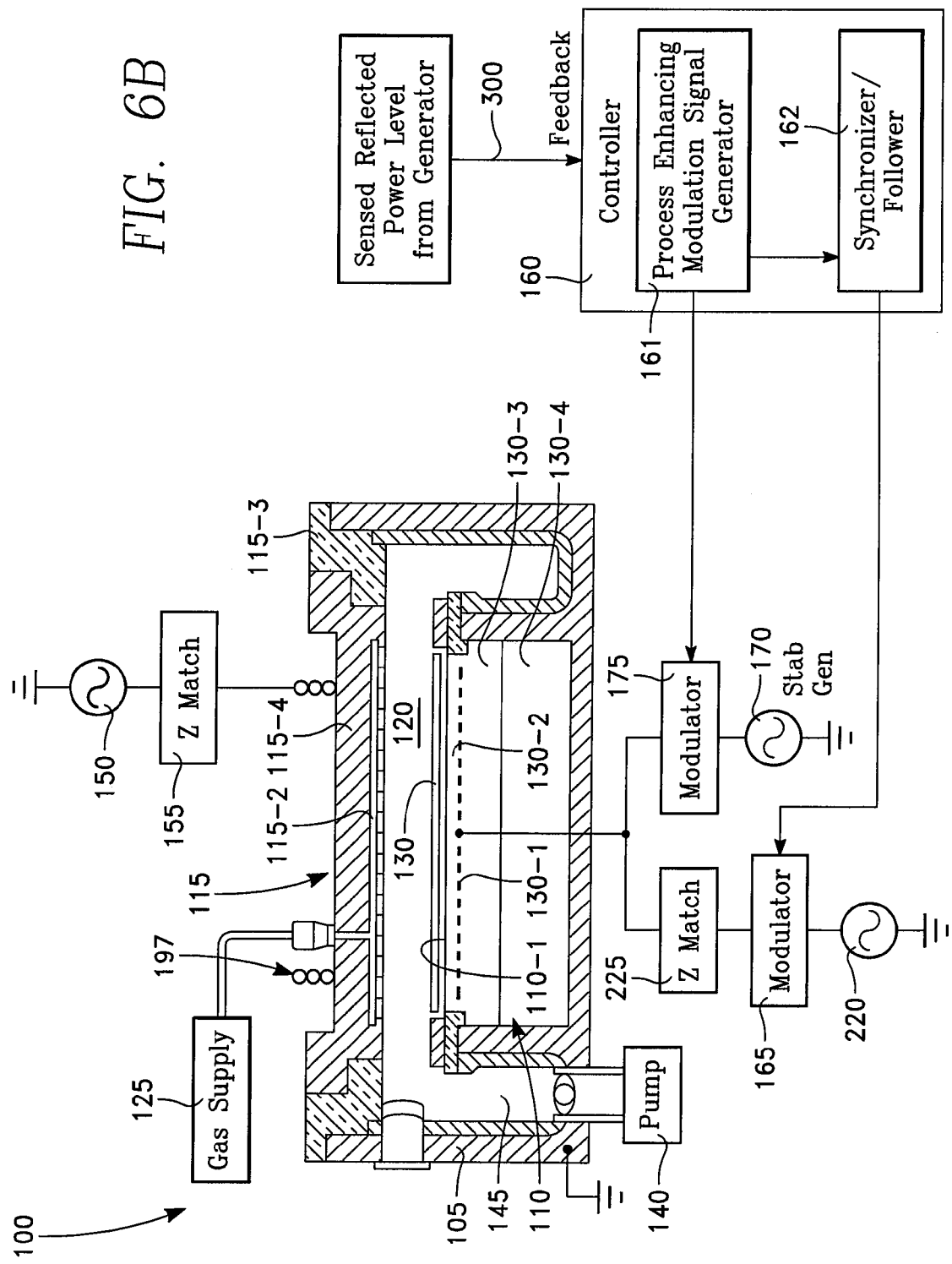

FIG. 6B depicts a modification of the reactor of FIG. 6A, in which the overhead electrode 115-1 is replaced by a dielectric ceiling 115-4, and an inductive coil antenna 197 overlying the ceiling 115 receives the RF source power from the generator 150 through the impedance match 155. The plasma is generated by inductive coupling, in which case the frequency of the source power generator 150 may be in the HF or LF range rather than VHF.

Figure 7A:
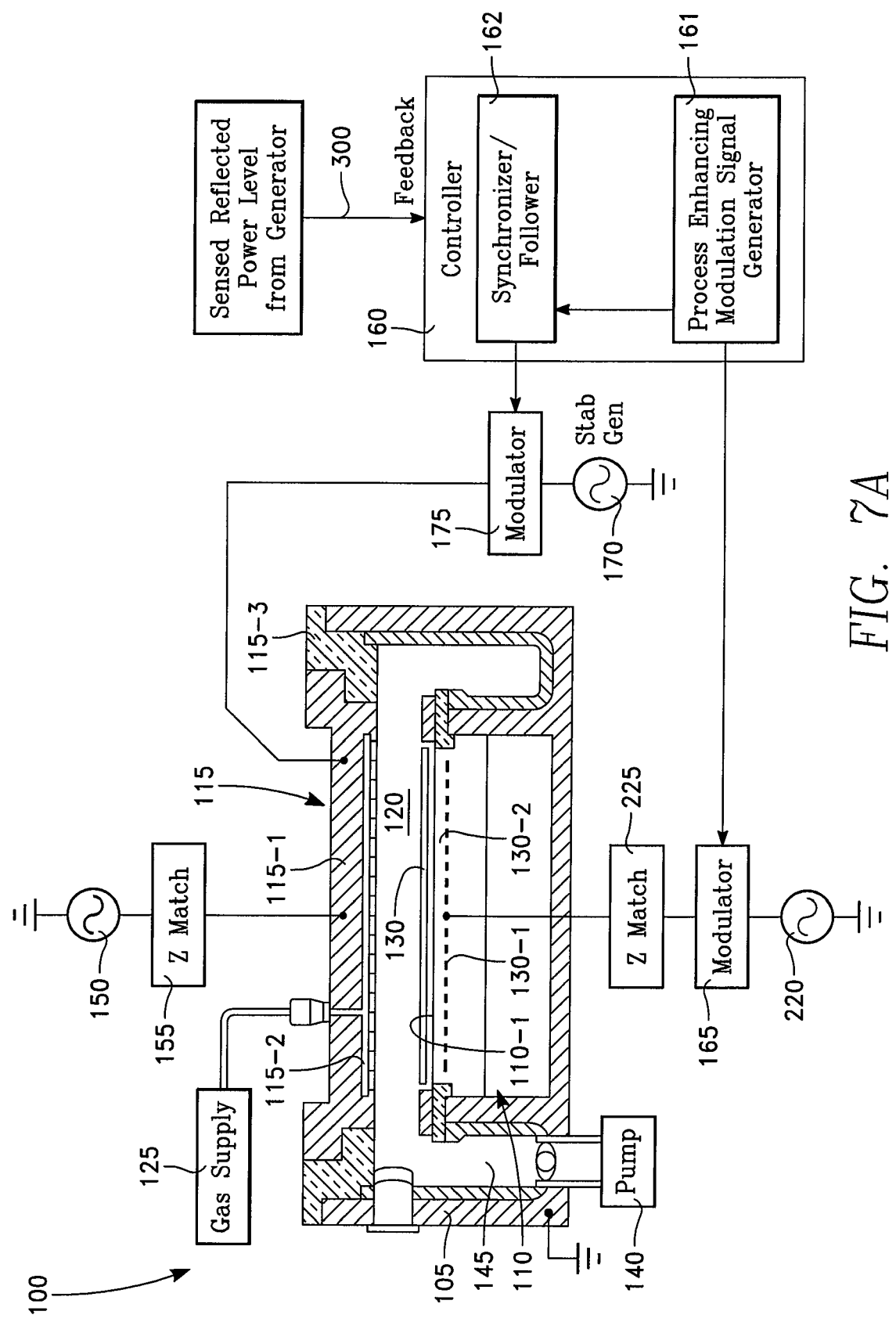

FIG. 7A depicts a modification of the reactor of FIG. 6A in which the output of the stabilization RF power generator 170 and modulator 175 is coupled to the ceiling electrode, without an intervening impedance match element, rather than being coupled to the wafer support electrode 130-1.

Figure 7B:
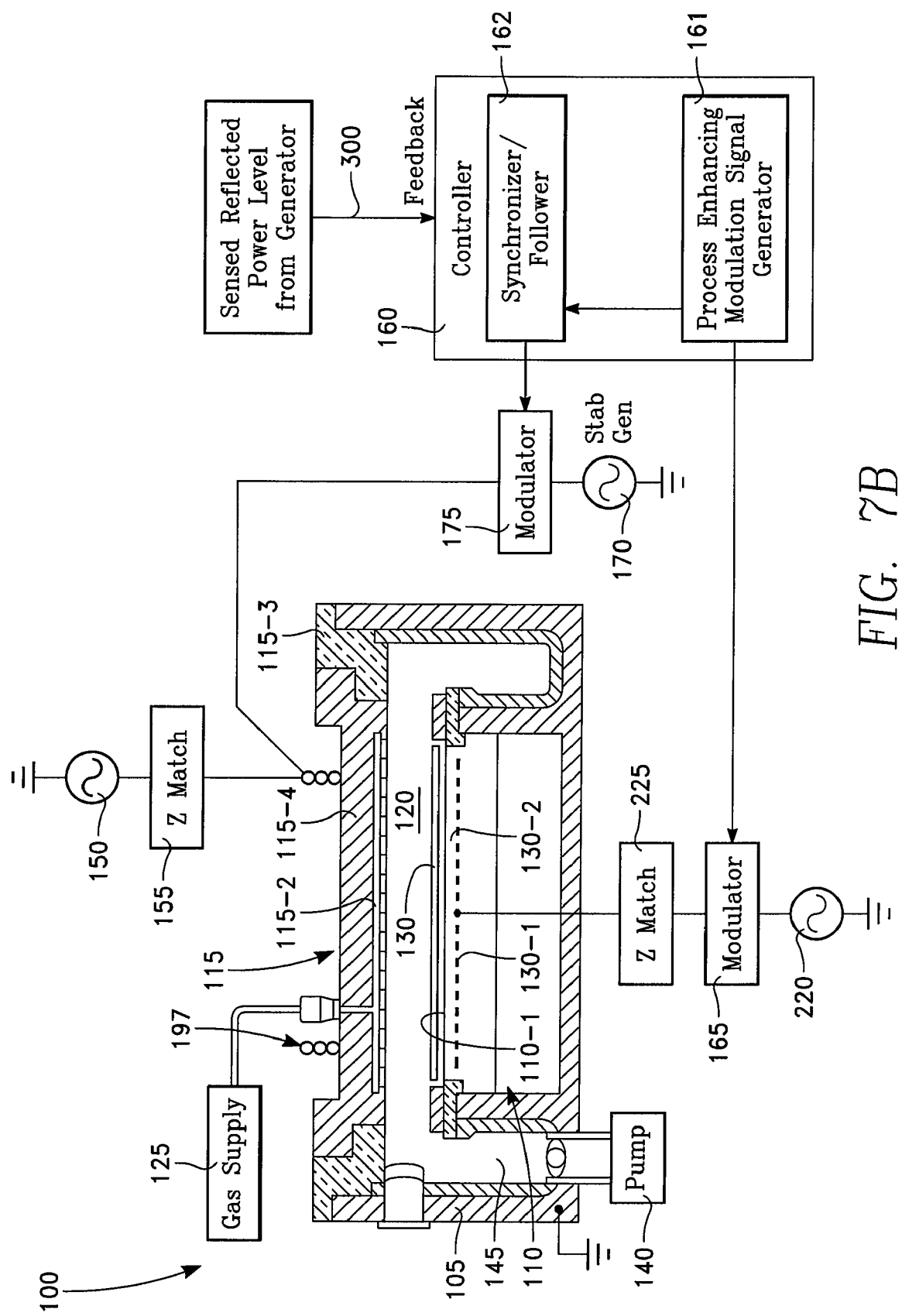

FIG. 7B depicts a modification of the reactor of FIG. 7A, in which the overhead electrode 115-1 is replaced by a dielectric ceiling 115-4, and an inductive coil antenna 197 overlying the ceiling 115 receives the RF source power from the generator 150 through the impedance match 155. The plasma is generated by inductive coupling, in which case the frequency of the source power generator 150 may be in the HF or LF range rather than VHF. The output of the stabilization power generator 170 and its modulator 175 may be coupled directly to the coil antenna 197, as depicted in the drawing, in which case the stabilization power generator 170 may be an HF or LF generator to have the desired effect upon plasma electron density. Alternatively, the ceiling 115 may include an overhead electrode (not shown) that is nearly transparent to the coil antenna 197, such as a Faraday shield for example. In this alternative case, the frequency of the stabilization generator 170 is a VHF frequency in order to affect plasma electron density through capacitive coupling.

Operation of the reactor of FIG. 6A is depicted in the contemporaneous waveform diagrams of FIGS. 8A-8F. FIG. 8A depicts the time domain waveform of the output of the bias generator 220 as modulated by the modulator 165 in an example in which a single transient is introduced in the bias power. The transient may be any sort of modulation, such as (for example) ramp modulation, sawtooth modulation, exponential burst modulation or pulse modulation or any transient or modulation having a Fourier component of at least 10 Hz. In the example of FIG. 8A, the transient is modulation by a single pulse, although the transient or modulation may be repeated. FIG. 8B depicts the corresponding behavior of the plasma electron density, which drops with the pulse increase of the bias power. FIG. 8C depicts the resulting fluctuation in RF power reflected back to the source power generator 150 as a result of the changes in the resistive component of the plasma impedance the follow the fluctuations in plasma electron density. The behavior depicted in FIGS. 8B and 8C is in the absence of any impedance stabilization RF power from the generator 170 and modulator 175. FIG. 8D depicts the power envelope of the output of the VHF stabilization power generator 170 and modulator 175. The pulsed VHF power from the generator 170 opposes drops in plasma electron density occurring with each pulse of the bias power. FIG. 8E depicts the reduced fluctuation in electron density as a result of the power from the stabilization power generator 170. FIG. 8F depicts the RF power reflected back to the source power generator 150, the reflected power having been greatly reduced by the stabilization of the plasma electron density and plasma impedance.

Figure 9A:
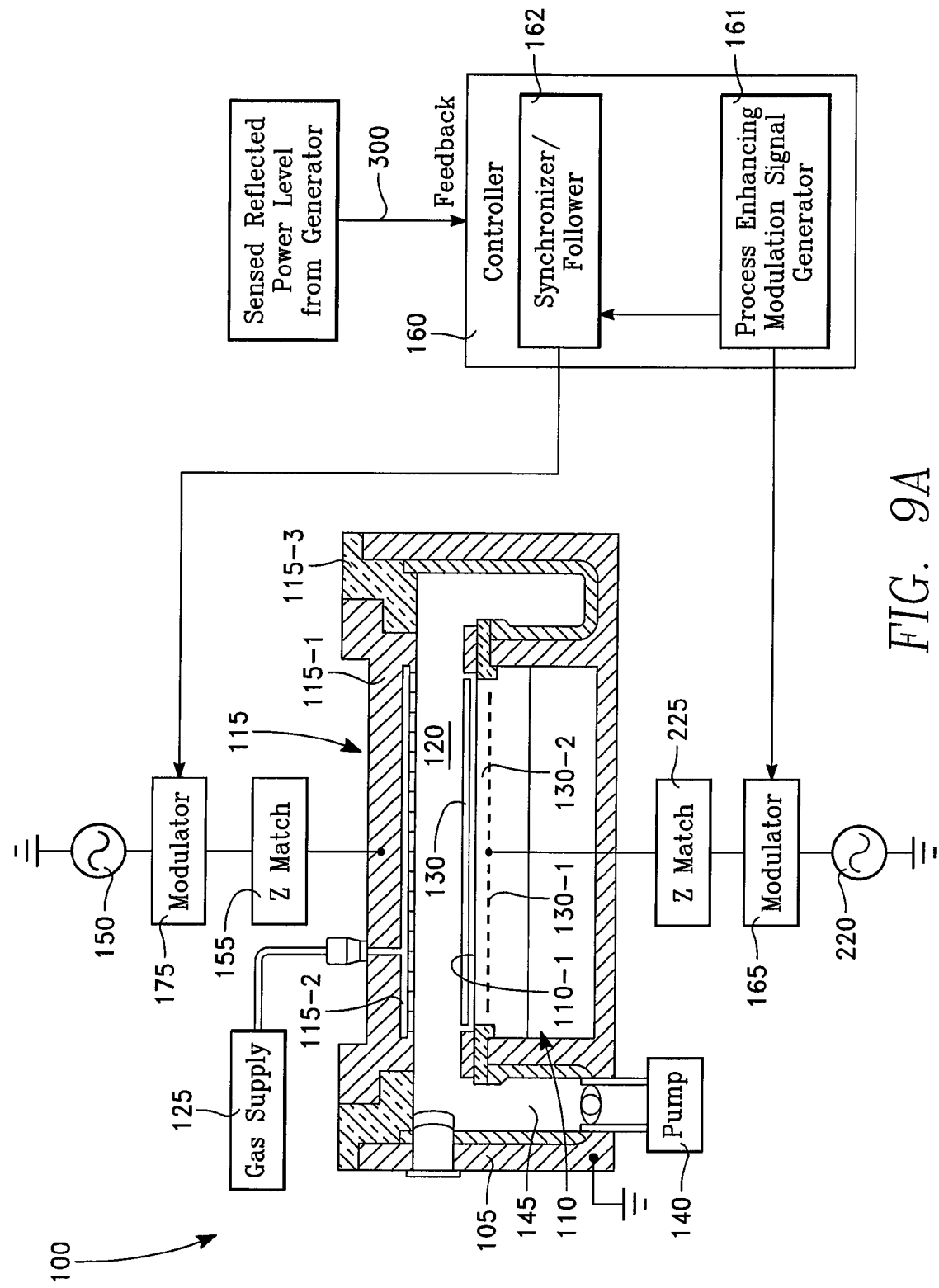
FIGS. 9A and 9B depict embodiments in which stabilization RF power is obtained by modulating the plasma source power generator output.

FIG. 9A depicts a modification of the reactor of FIG. 7A, in which the plasma electron density is stabilized against the engineered transients in the RF bias power without providing a separate stabilization RF power generator. Instead, stabilization is attained by modulating the VHF source power generator 150, using a low degree (e.g., 5%) of modulation. As shown in the drawing of FIG. 9A, the stabilization modulator 175 is interposed between the VHF source power generator 150 and the VHF impedance match 155.

Figure 9B:
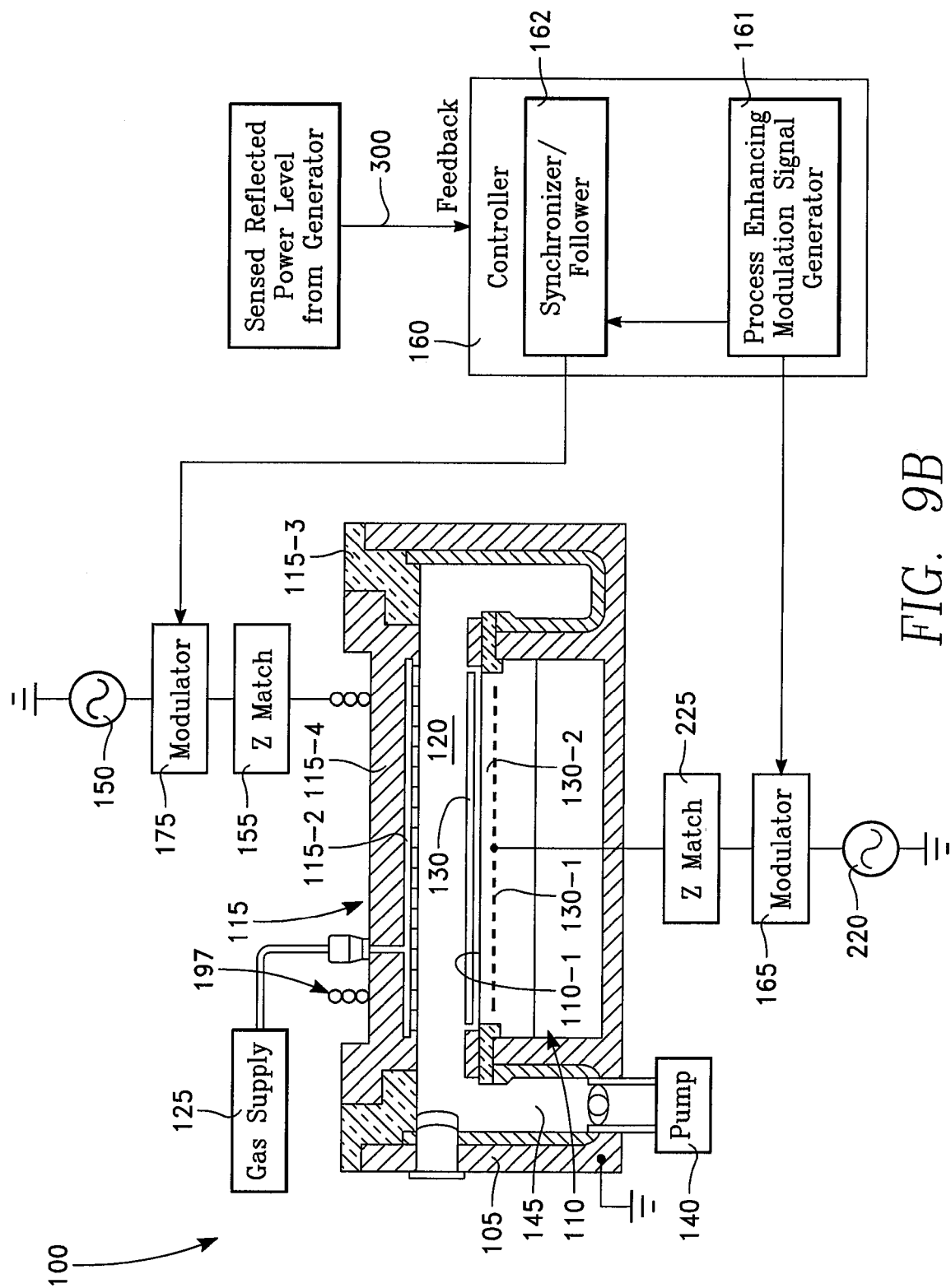

FIG. 9B depicts a modification of the reactor of FIG. 9A, in which the overhead electrode 115-1 is replaced by a dielectric ceiling 115-4, and an inductive coil antenna 197 overlying the ceiling 115 receives the RF source power from the generator 150 through the impedance match 155. The plasma is generated by inductive coupling, in which case the frequency of the source power generator 150 may be in the HF or LF range rather than VHF.

Figure 10:
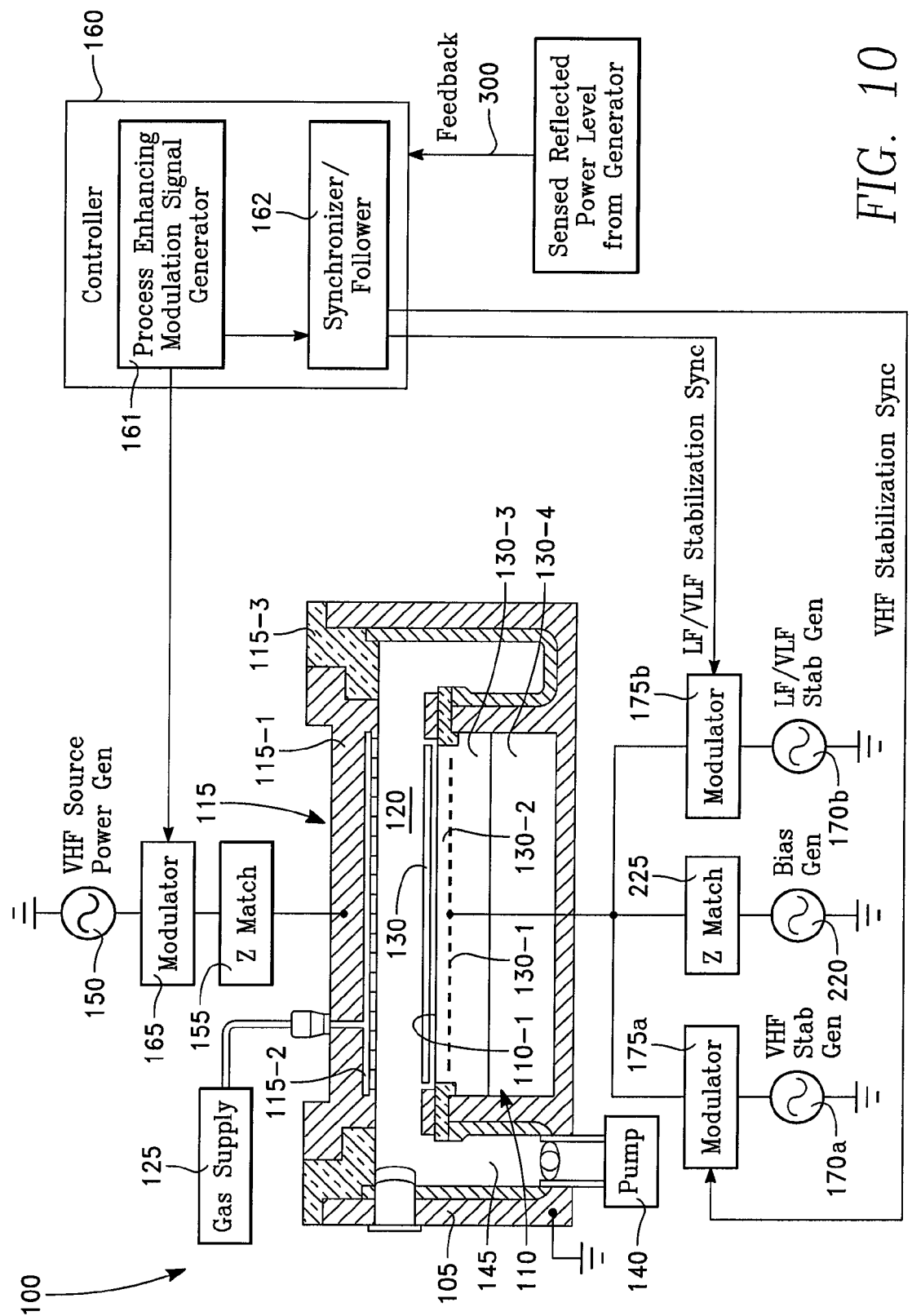
FIG. 10 depicts an embodiment employing a pair of stabilization RF power generators operated in push-pull or out-of-phase relationship.

In some embodiments, different fluctuations in plasma impedance are compensated during different phases of the engineered transient. For example, if the engineered transient includes pulse modulating the VHF bias power generator, then during the pulse "on" time a decrease in plasma sheath thickness is compensated, while during the pulse "off" time a decrease in plasma electron density is compensated. This requires two stabilization RF power generators, namely a LF or VLF power generator active during the pulse "on" time for opposing a decrease in plasma sheath thickness, and a VHF power generator for opposing a drop in plasma electron density during the pulse "off" time. A reactor having this capability is depicted in FIG. 10. The reactor of FIG. 10 is a modification of the reactor of FIG. 1A. In this modification, there are two stabilization RF power generators including a VHF stabilization generator 170a and an LF or VLF stabilization generator 170b with respective modulators 175a, 175b at their outputs and coupled to the wafer support electrode 130-1. Furthermore, the synchronization follower 162 produces separate control signals to the modulators 175a, 175b that cause the output of the two stabilization generators 170a, 170b to have different phases and (if desired) different amplitudes. In the present example, the outputs of the two generators 175a, 175b are out of phase.

Operation of the embodiment of the reactor of FIG. 10 is described with reference to FIGS. 11A through 11G. FIG. 11A illustrates the pulsed modulation of the VHF source power. FIG. 11A depicts an example in which a single transient is introduced. The transient may be any sort of modulation, such as (for example) ramp modulation, sawtooth modulation, exponential burst modulation or pulse modulation or any transient or modulation having a Fourier component of at least 10 Hz. In the example of FIG. 11A, the transient is a single pulse, although the transient or modulation may be repeated. FIGS. 11B and 11C depict the corresponding behavior of the plasma sheath thickness and the plasma electron density, respectively, in the absence of stabilization. FIG. 11D depicts the output of the LF or VLF stabilization generator 170b and FIG. 11E depicts the resulting reduced fluctuations in the plasma sheath thickness. FIG. 11F depicts the output of the VHF stabilization generator and FIG. 11G depicts the resulting reduced fluctuations in plasma electron density.

Figure 12A:
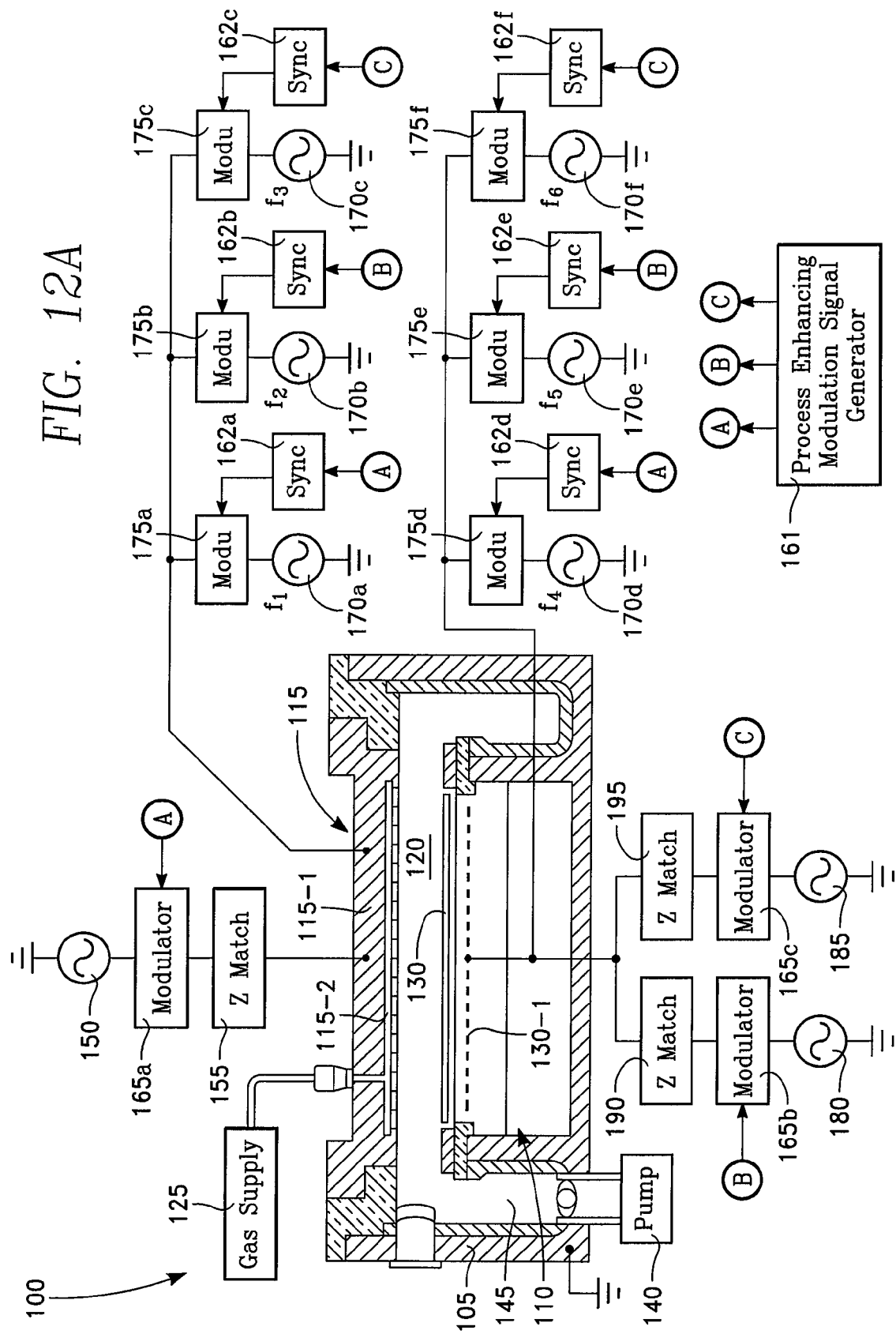
FIGS. 12A and 12B depict embodiments employing an array of plural stabilization RF power generators with plural sources of engineered transients.

Various configurations of multiple independent stabilization RF power generators are possible. FIG. 12A depicts a plasma reactor having an array of stabilization generators 170a, 170b, 170c coupled through respective modulators 175a, 175b, 175c to the overhead electrode 115-1, and an array of stabilization generators 170d, 170e, 170f coupled to the wafer support electrode 130-1 through respective modulators 175d, 175e, 175f. In addition, the outputs of the source power generator 150, the bias power generator 180 and the bias power generator 185 can be modulated by respective modulators 165a, 165b, 165c by independent control signals (labeled A, B and C in FIG. 10A) produced by the process enhancing modulation signal generator 161. Control signal A modulates the VHF source power when activated. It further controls, through respective synchronization followers 162a, 162d, the outputs of the stabilization generators 170a, 170d, if activated, whose frequencies are selected to effectively compensate for transients in the VHF power. Control signal B modulates the HF bias power when activated. It further controls, through respective synchronization followers 162b, 162e, the outputs of the stabilization generators 170b, 170e, if activated, whose frequencies are selected to effectively compensate for transients in the HF bias power. Control signal C modulates the LF bias power when activated. It further controls, through respective synchronization followers 162c, 162f, the outputs of the stabilization generators 170c, 170f, if activated, whose frequencies are selected to effectively compensate for transients in the LF bias power. The responses of the various synchronization followers 162a through 162f may be in phase, out of phase, asynchronous or synchronous, push-pull, etc., to achieve the desired plasma impedance stabilization.

Figure 12B:
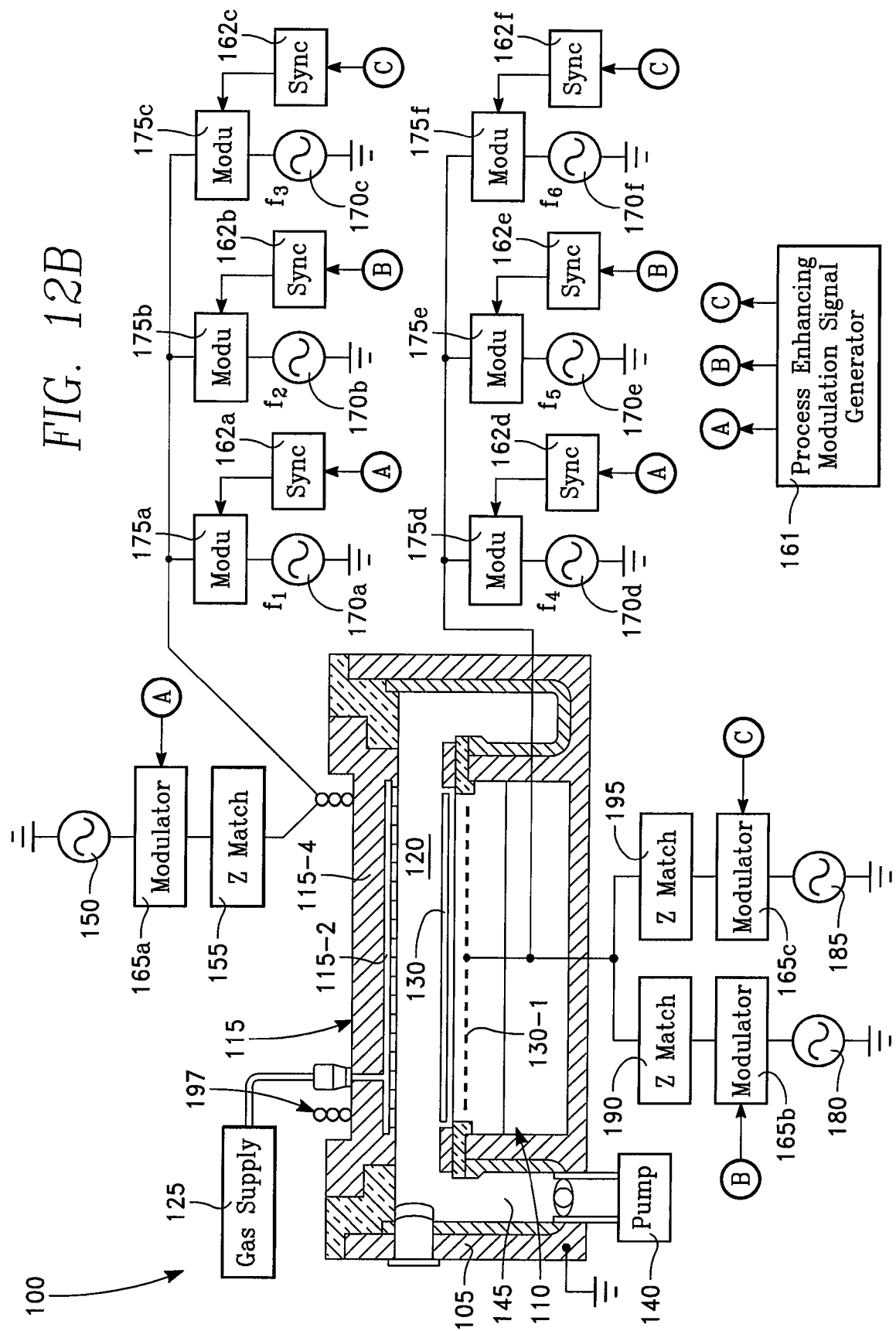
Figure 13:
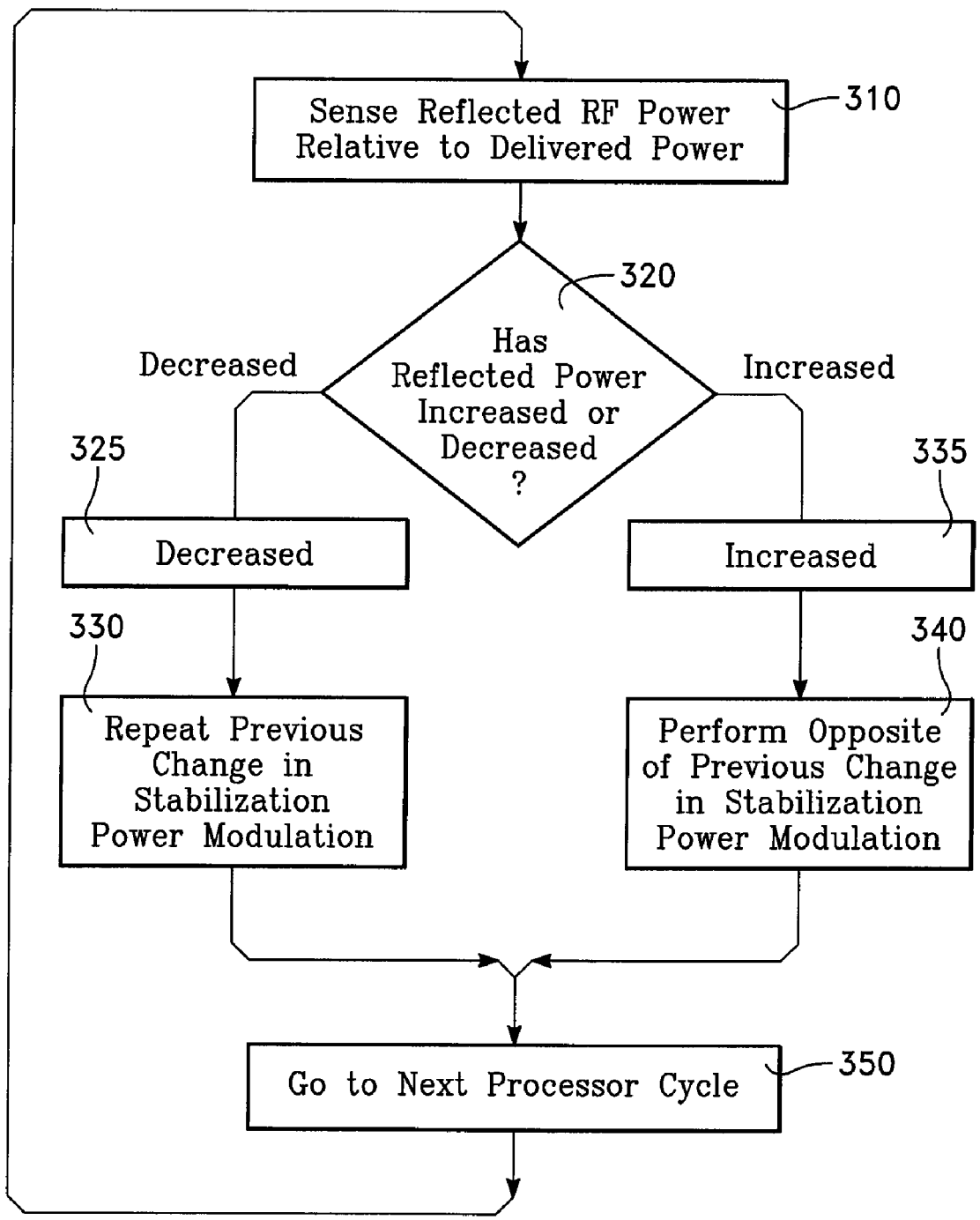
FIG. 13 depicts the operation of an optional reflected power feedback control loop in the foregoing embodiments.

FIG. 12B depicts a modification of the reactor of FIG. 12A, in which the overhead electrode 115-1 is replaced by a dielectric ceiling 115-4, and an inductive coil antenna 197 overlying the ceiling 115 receives the RF source power from the generator 150 through the impedance match 155. The plasma is generated by inductive coupling, in which case the frequency of the source power generator 150 may be in the HF or LF range rather than VHF.

The modulation of the stabilization RF power may be controlled in real time to minimize reflected RF power sensed in real time at the source power generator (or at any bias power generator). For example, in FIG. 1A, reflected RF power sensed at the source power generator 150 (using conventional techniques) relative to delivered (or total) RF power is furnished to the controller 160 as feedback signal at a reflected power sensor output 300 from the source power generator 150 in the foregoing embodiments. Alternatively, the reflected power sensor output may be from one of the RF bias power generators 180, 185. The controller 160 adjusts the degree of modulation of the stabilization power generator 170 (e.g., between 0% and 100% modulation) to minimize the reflected power. The controller 160 may be programmed with a trial-by-error algorithm, in which the controller 160 performs many processor cycles during each transient or pulse duration. In each processor cycle, the controller 160 determines whether the reflected power has increased since the previous processor cycle, and meets an increase in reflected power during the subsequent processor cycles by determining whether an increase or decrease in modulation of the stabilization generator output decreases the sensed reflected power during the next processor cycle. A successful trial leads the processor 160 to repeat whatever action preceded that success, i.e., either an increase or decrease in degree of modulation. The various embodiments illustrated in the drawings discussed above are illustrated as having the feature of the feedback input 300 of sensed reflected power from the source power generator 150 (FIGS. 1, 3A-3C, 4A-4D) and/or from a bias power generator 180 or 185 (FIGS. 6A-6B, 7A-7B and 9A-9B).

One example of the operation of such a feedback loop by the controller 160 is depicted in FIG. 11 during a single processor cycle which is one of a succession of processor cycles. The first step (block 310) is to sense the reflected RF power at the source power generator 150 or bias power generator (180 or 185) of interest. The controller 160 then determines whether the reflected RF power has decreased or increased since the last processor cycle (block 320 of FIG. 11). If it has decreased (block 325), the prior change (if any) made to the stabilization power modulation (either a decrease or an increase in modulation percentage) is repeated (block 330). Such a change is a predetermined shift in the modulation percentage (e.g., by ±1%). Otherwise, if the reflected power has increased (block 335), the prior change made is reversed (block 340). This completes the current processor cycle, and the controller goes to the next processor cycle (block 350) and repeats the foregoing.

The plasma capacitance and resistance combines to change the plasma response to the sharp edges of the engineered transient so that it does not conform with the square edges, for example of pulse modulated source power. The near instantaneous rise time of the edge of the plasma source power pulse modulation of FIGS. 1A and 2A (for example) induce a response in the plasma impedance having much longer rise times and smooth transitions without sharp edges. Therefore, a more accurate stabilization of plasma impedance requires the response of the stabilization RF power generator 170 (as determined by its modulator 175) to mimic the more gradual rise times and smoothed edges of the plasma response. Such an accurate response is obtained using the embodiment of the synchronizer follower 162 of FIG. 14. The synchronizer follower 162 of FIG. 14 conditions the signal (e.g., a pulse signal) from the process enhancing modulation signal generator 161. First, the amplitude is adjusted by an amplitude adjustment circuit 162-1. The response is delayed by a delay circuit 162-2. The response is shaped by a waveform shaping circuit 162-3. The waveform shaping circuit 162-3 in combination with the delay circuit 162-2 reproduces the R-C characteristics of the plasma response.

Figure 14:
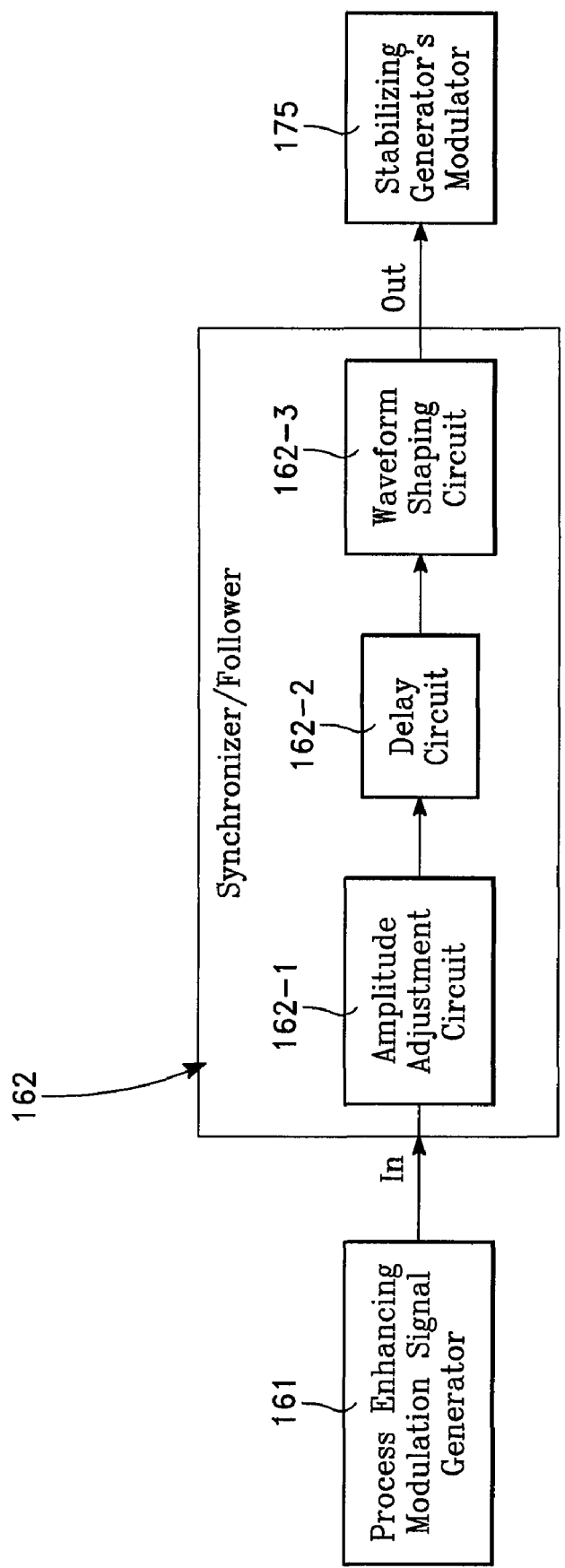
FIG. 14 depicts one embodiment of the synchronizer follower that can be used in the foregoing embodiments.

FIGS. 15A-15F depict the operation of the reactor of FIG. 1 using the synchronizer follower 162 of FIG. 14. FIG. 15A depicts the sharp pulse modulation of the source power. FIG. 15A depicts an example in which a single transient is introduced. The transient may be any sort of modulation, such as (for example) ramp modulation, sawtooth modulation, exponential burst modulation or pulse modulation or any transient or modulation having a Fourier component of at least 10 Hz. In the example of FIG. 15A, the transient is a single pulse, although the transient or modulation may be repeated. FIG. 15B depicts the response of the plasma sheath thickness having delayed exponential leading and trailing edges, in accordance with an R-C time constant of the plasma. FIG. 15C depicts the reflected power at the source power generator in the absence of stabilization. FIG. 15D depicts the waveform of the stabilization RF power obtained using the synchronization follower 162 of the embodiment of FIG. 14, which more accurately follows the exponential response of the plasma sheath thickness of FIG. 15B. FIGS. 15E and 15F depict the reduced fluctuations in plasma sheath thickness and reflected power obtained using the stabilization RF power of FIG. 15D.

Figures 16A, 16B, 16C, 16D, 16E, 16F, 16G, 16H:
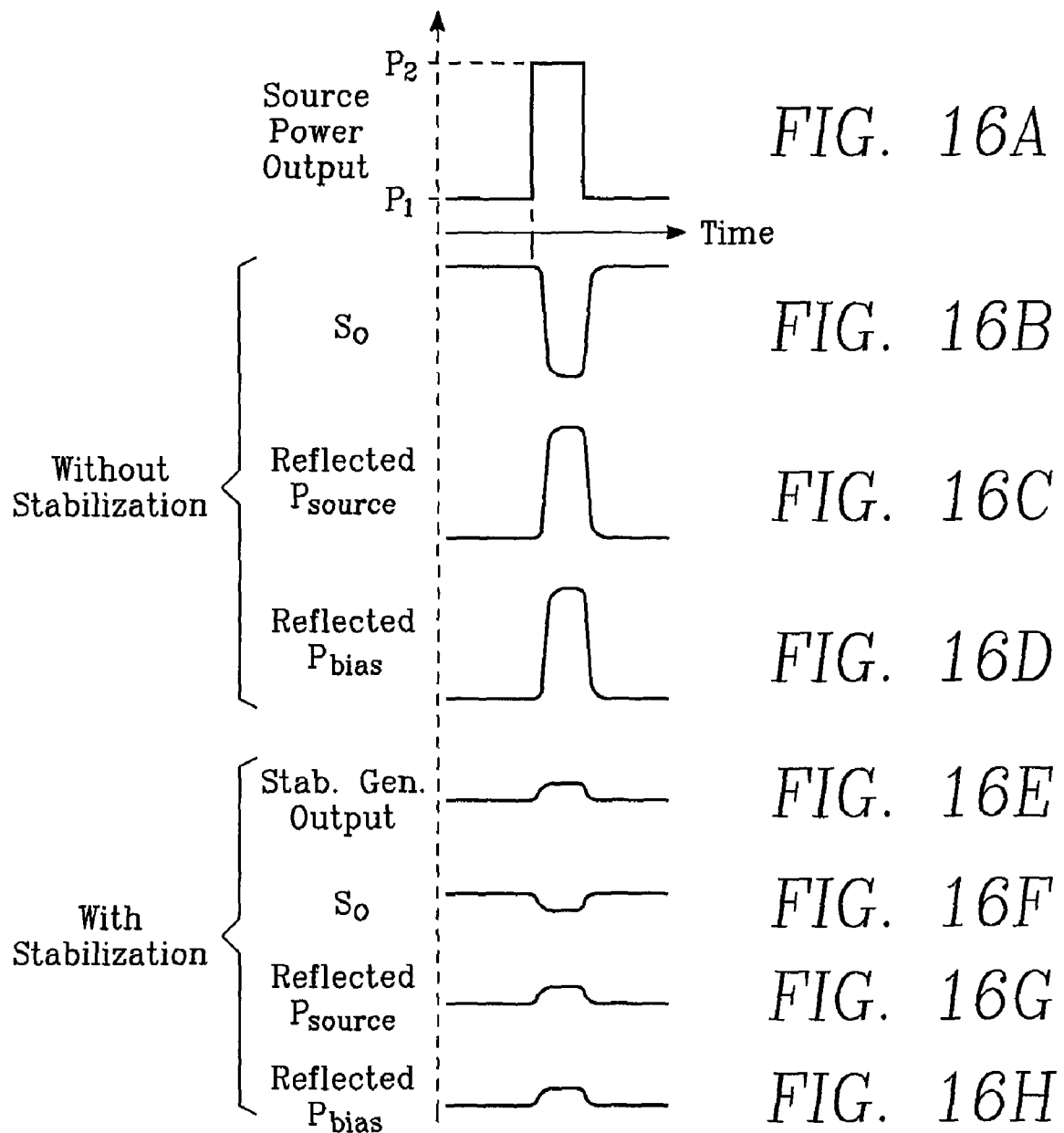
FIGS. 16A through 16H are contemporaneous time domain waveforms depicting operation of the embodiment of FIG. 4B with the synchronizer follower of FIG. 14.

FIGS. 16A-16H depict the operation of the reactor of FIG. 4B using the synchronizer follower 162 of FIG. 14. FIG. 16A depicts the sharp pulse modulation of the source power. FIG. 16A depicts an example in which a single transient is introduced. The transient may be any sort of modulation, such as (for example) ramp modulation, sawtooth modulation, exponential burst modulation or pulse modulation or any transient or modulation having a Fourier component of at least 10 Hz. In the example of FIG. 16A, the transient is a single pulse, although the transient or modulation may be repeated. FIG. 16B depicts the response of the plasma sheath thickness having delayed exponential leading and trailing edges, in accordance with an R-C time constant of the plasma. FIGS. 16C and 16D depict the reflected power at the source power generator and at a bias power generator, respectively, in the absence of stabilization. FIG. 16E depicts the waveform of the stabilization RF power obtained using the synchronization follower 162 of the embodiment of FIG. 14, which more accurately follows the exponential response of the plasma sheath thickness of FIG. 16B. FIG. 16F depict the reduced fluctuations in plasma sheath thickness obtained using the stabilization RF power of FIG. 16E. FIGS. 16G and 16H depict the reduced fluctuations in reflected power at the source power generator and the bias power generator, respectively.

FIGS. 17A-16F depict the operation of the reactor of FIG. 6A using the synchronizer follower 162 of FIG. 14. FIG. 17A depicts the sharp pulse modulation of the source power. FIG. 17A depicts an example in which a single transient is introduced. The transient may be any sort of modulation, such as (for example) ramp modulation, sawtooth modulation, exponential burst modulation or pulse modulation or any transient or modulation having a Fourier component of at least 10 Hz. In the example of FIG. 17A, the transient is a single pulse, although the transient or modulation may be repeated. FIG. 17B depicts the response of the plasma electron density having delayed exponential leading and trailing edges, in accordance with an R-C time constant of the plasma. FIG. 17C depicts the reflected power at the source power generator, in the absence of stabilization. FIG. 17D depicts the waveform of the stabilization VHF power obtained using the synchronization follower 162 of the embodiment of FIG. 14, which more accurately follows the exponential response of the plasma electron density of FIG. 17B. FIG. 17E depict the reduced fluctuations in plasma electron density obtained using the stabilization RF power of FIG. 17D. FIG. 17F depicts the reduced fluctuations in reflected power at the source power generator.

While the foregoing is directed to embodiments of the present invention, other and further embodiments of the invention may be devised without departing from the basic scope thereof, and the scope thereof is determined by the claims that follow.

What is claimed is:
1. A plasma reactor including a chamber for processing a workpiece, comprising:

plural impedance matches and plural RF plasma power generators coupled to deliver respective RF plasma powers into said chamber through respective ones of said impedance matches;

a controller for generating a time-varying modulation control signal corresponding to a desired process transient cycle and an amplitude modulator coupled to modulate the output of a first one of said generators in response to said time-varying modulation control signal; and a follower modulator coupled to modulate the output of a second one of said generators in response to said time-varying modulation control signal;

wherein:

said first generator provides a signal representing a measured level of RF power reflected back to the first generator, said signal being coupled to said controller; and said controller being programmed to alter the degree of modulation of said second generator to minimize said measured level of RF power reflected back to said first generator.

2. The reactor of claim 1 wherein said first generator is an RF plasma source power generator, and wherein second generator is an RF bias power generator having a frequency at which over 80% of RF power contributes to plasma sheath thickness.

3. The reactor of claim 2 wherein said frequency of said RF bias power generator is in or below an LF frequency range.

4. The reactor of claim 1 wherein said follower modulator comprises an R-C circuit for imposing a delay in the output of said second generator relative to said control signal.

5. The reactor of claim 1 wherein said control signal corresponds to a transient that is one of (a) rectangular wave pulsing, (b) triangular wave.

6. A plasma reactor including a chamber with gas distribution apparatus for processing a workpiece, comprising:

an RF plasma source power applicator;

a source power impedance match and an RF plasma source power generator coupled to said RF plasma source power applicator through said source power impedance match;

a controller for providing a time-varying modulation control signal corresponding to a desired process transient cycle and an amplitude modulator coupled to modulate the output of said source power generator in response to said time-varying modulation control signal; and an RF bias power generator operatively coupled to deliver RF bias power to said workpiece, and a follower modulator coupled to modulate the output of said RF bias power generator in response to said time-varying modulation control signal;

wherein:

said RF bias power generator has a frequency at which over 80% of RF power contributes to plasma sheath thickness;

said source power generator provides a signal representing a measured level of RF power reflected back to the source power generator, said signal being coupled to said controller; and said controller being programmed to alter the degree of modulation of said bias power generator to minimize said measured level of RF power reflected back to said generator.

7. The reactor of claim 6 wherein said frequency of said RF bias power generator is in or below the LF frequency range.

8. The reactor of claim 6 wherein said follower modulator comprises an R-C circuit for imposing a delay in the modulation of said RF bias power generator relative to said control signal.

* * * * *